(12) United States Patent
Hanaoka et al.

(10) Patent No.: US 8,367,517 B2
(45) Date of Patent: Feb. 5, 2013

(54) METHOD FOR MANUFACTURING SOI SUBSTRATE

(75) Inventors: Kazuya Hanaoka, Kanagawa (JP);
Hideki Tsuya, Kanagawa (JP);
Yoshihiro Komatsu, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/011,355

(22) Filed: Jan. 21, 2011

(65) Prior Publication Data
US 2011/0183445 A1    Jul. 28, 2011

(30) Foreign Application Priority Data

Jan. 26, 2010   (JP) ................... 2010-014880

(51) Int. Cl.
*H01L 21/30* (2006.01)
(52) U.S. Cl. ........ 438/455; 438/456; 438/458; 438/459; 257/E21.568; 257/E21.57
(58) Field of Classification Search .................. 438/455, 438/456, 458, 459; 257/E21.568, E21.57
See application file for complete search history.

(56) References Cited

U.S. PATENT DOCUMENTS

| | | | |
|---|---|---|---|
| 5,374,564 A | 12/1994 | Bruel | |
| 6,492,682 B1 | 12/2002 | Akiyama et al. | |
| 6,613,678 B1 * | 9/2003 | Sakaguchi et al. | 438/695 |
| 7,405,136 B2 * | 7/2008 | Delprat et al. | 438/458 |
| 7,413,964 B2 * | 8/2008 | Reynaud et al. | 438/455 |
| 7,790,573 B2 | 9/2010 | Endo et al. | |
| 7,858,495 B2 * | 12/2010 | Ohnuma et al. | 438/458 |
| 2002/0182827 A1 * | 12/2002 | Abe et al. | 438/455 |
| 2005/0164471 A1 * | 7/2005 | Maleville | 438/458 |
| 2006/0228846 A1 * | 10/2006 | Endo et al. | 438/197 |
| 2007/0148914 A1 * | 6/2007 | Morita et al. | 438/458 |

(Continued)

FOREIGN PATENT DOCUMENTS

| | | |
|---|---|---|
| JP | 05-211128 A | 8/1993 |
| JP | 2000-036583 A | 2/2000 |

(Continued)

OTHER PUBLICATIONS

K. Kashima et al., "High-temperature hydrogen-annealed silicon wafer for next-generation ULSI devices,", OYOBUTURI, Nov. 10, 1994, vol. 63, No. 11, pp. 1114-1117, JSAP (The Japan Society of Applied Physics).

(Continued)

*Primary Examiner* — Hsien Ming Lee
(74) *Attorney, Agent, or Firm* — Nixon Peabody LLP; Jeffrey L. Costellia

(57) ABSTRACT

An insulating layer is formed over a surface of a semiconductor wafer to be the bond substrate and irradiation with accelerated ions is performed, so that an embrittlement region is formed inside the wafer. Next, this semiconductor wafer and a base substrate such as a glass substrate or a semiconductor wafer are attached to each other. Then, the semiconductor wafer is divided at the embrittlement region by heat treatment, whereby an SOI substrate is manufactured in which a semiconductor layer is provided over the base substrate with the insulating layer interposed therebetween. Before this SOI substrate is manufactured, heat treatment is performed on the semiconductor wafer at 1100° C. or higher under a non-oxidizing atmosphere such as an argon gas atmosphere or a mixed atmosphere of an oxygen gas and a nitrogen gas.

16 Claims, 12 Drawing Sheets

U.S. PATENT DOCUMENTS

| | | | |
|---|---|---|---|
| 2007/0148917 A1* | 6/2007 | Morita et al. | 438/459 |
| 2008/0124929 A1* | 5/2008 | Okuda et al. | 438/692 |
| 2008/0128851 A1* | 6/2008 | Aga et al. | 257/506 |
| 2008/0280420 A1 | 11/2008 | Yamazaki | |
| 2008/0296724 A1* | 12/2008 | Yamazaki et al. | 257/506 |
| 2009/0023269 A1* | 1/2009 | Morimoto et al. | 438/458 |
| 2009/0098704 A1 | 4/2009 | Ohnuma et al. | |
| 2009/0209085 A1 | 8/2009 | Tamura et al. | |

FOREIGN PATENT DOCUMENTS

| | | | |
|---|---|---|---|
| JP | 2001-144275 A | 5/2001 | |
| JP | 2006-294737 A | 10/2006 | |
| JP | 2007-251129 A | 9/2007 | |
| JP | 2008-021892 A | 1/2008 | |

OTHER PUBLICATIONS

Kazuhiko Kasiiima et al. "IIigh-Temperature IIydrogen-Annealed Silicon Wafer for Next-Generation ULSI Devices", OYOBTURI, Nov. 10, 1994, vol. 63, No. 11, pp. 1114-1117.

\* cited by examiner

FIG. 2A
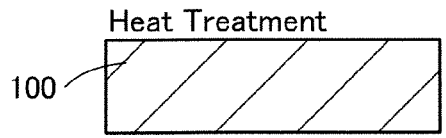
FIG. 2B
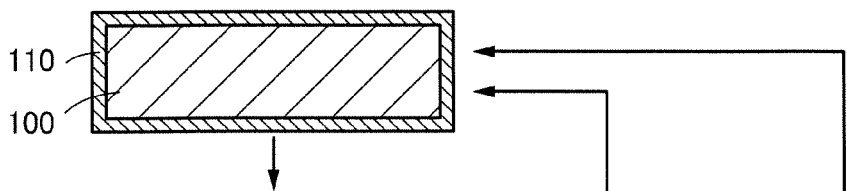
FIG. 2C
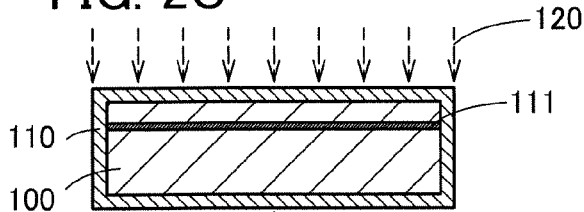
FIG. 2H
Heat Treatment
(Wafer Reprocessing)
FIG. 2D
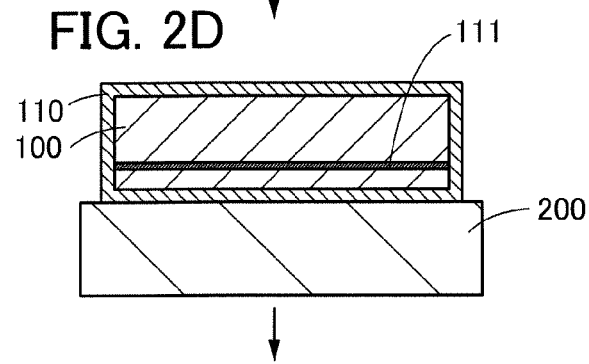
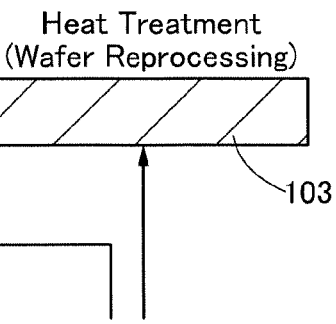
FIG. 2G
Planarization Treatment
(Wafer Reprocessing)
FIG. 2E
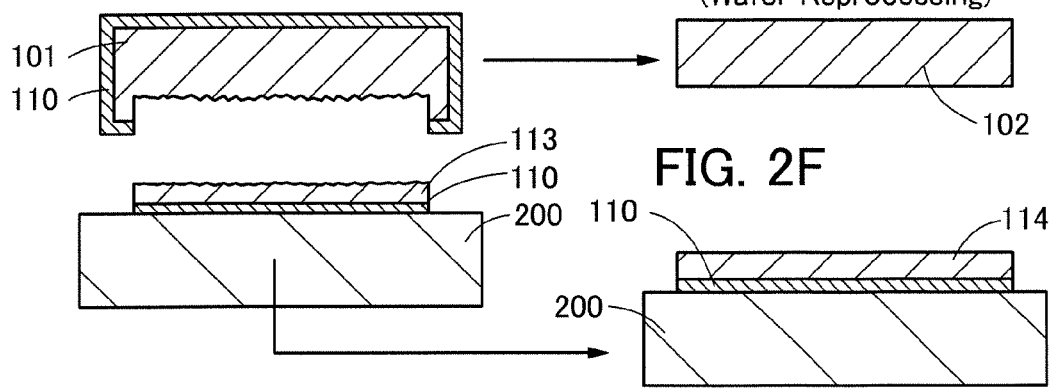
FIG. 2F

METHOD FOR MANUFACTURING SOI SUBSTRATE

BACKGROUND OF THE INVENTION

1. Field of the Invention

In this specification, a technique relating to a method for manufacturing a substrate having a silicon-on-insulator (SOI) structure in which a semiconductor layer is provided on a substrate with an insulating layer interposed therebetween is described. Further, a technique relating to a reprocessing method of a semiconductor wafer which has been used in manufacturing this SOI substrate is described.

2. Description of the Related Art

A semiconductor substrate having an SOI structure (hereinafter referred to as an SOI substrate) in which a semiconductor layer is provided on a substrate with an insulating layer interposed therebetween has attracted attention as a substrate suitable for manufacturing an LSI which has low power consumption and can operate at high speed.

One of known methods for manufacturing an SOI substrate is a hydrogen ion implantation separation method (e.g., see Patent Document 1). As described in Patent Document 1, an SOI substrate is manufactured using two bulk silicon wafers in the hydrogen ion implantation separation method. One of the two bulk silicon wafers serves as a bond substrate (also referred to as a donor substrate) and the other serves as a base substrate. The bond substrate provides a semiconductor layer, and the base substrate forms the SOI substrate body. A method for manufacturing an SOI substrate by the hydrogen ion implantation separation method is briefly described below.

An oxide film is formed on the bond substrate by a thermal oxidation method, and then irradiation with hydrogen ions is performed to form a microbubble layer inside the bond substrate. Then, the bond substrate and the base substrate are disposed in close contact with each other with the oxide film interposed therebetween and bonded to each other. After that, heat treatment is performed and the bond substrate is divided at the microbubble layer, so that a silicon layer is formed on the base substrate with a thermal oxide film (insulating layer) interposed therebetween. The silicon layer is a semiconductor layer which has been separated from the bond substrate. Then, heat treatment or the like is performed on the base substrate in order to strengthen the attachment between the silicon layer and the base substrate, so that an SOI substrate is completed. Further, in the hydrogen ion implantation separation method, the bond substrate from which the silicon layer has been separated can be reused, and the used bond substrate is reprocessed and reused.

However, oxygen is incorporated into the bond substrate because of the manufacturing method; therefore, crystal defects due to oxygen such as oxide precipitate, dislocation, or stacking fault are formed in the vicinity of a surface of the bond substrate which forms the semiconductor layer by heat treatment in the manufacturing process of an SOI substrate (typically, heat treatment in a step of forming the thermal oxide film and a step of dividing the bond substrate). Accordingly, the crystal defects in the vicinity of the surface need to be reduced in order to reuse the bond substrate.

For example, Non-Patent Document 1 discloses that crystal defects in the vicinity of a surface of a CZ silicon wafer can be reduced by annealing at 1200° C. under a hydrogen gas atmosphere (the proportion of the hydrogen is 100%).

In addition, Patent Documents 2 to 4 each disclose reuse of a bond substrate.

Patent Document 2 discloses that in order to increase the number of times of use of a bond substrate, a silicon wafer formed by slicing an ingot is used for a bond substrate. The ingot is grown by a CZ method and includes neither aggregate of vacancy-type point defects whose oxygen concentration is $5 \times 10^{17}$ atoms/cm$^3$ to $14 \times 10^{17}$ atoms/cm$^3$, nor aggregate of interstitial-silicon-type point defects.

Patent Document 3 discloses that by performing heat treatment rapidly on a bond substrate from which a silicon layer has been separated at 1150° C. to 1300° C., oxide precipitate in the bond substrate can be reduced.

Patent Document 4 discloses that a CZ wafer with few defects whose whole surface is formed using an N region is used as a bond substrate and RTA treatment is performed as reprocessing treatment of the bond substrate at higher temperature than that in a step of forming a thermal oxide film performed on the bond substrate.

REFERENCE

[Patent Document]

[Patent Document 1] Japanese Published Patent Application No. H5-211128.

[Patent Document 2] Japanese Published Patent Application No. 2006-294737.

[Patent Document 3] Japanese Published Patent Application No. 2007-251129.

[Patent Document 4] Japanese Published Patent Application No. 2008-21892.

[Non-Patent Document]

[Non-Patent Document 1] K. Kashima and H. Hirano, "High-temperature hydrogen-annealed silicon wafer for next-generation ULSI devices" *OYO BUTURI*, 1994, Vol. 63, No. 11, pp. 1114-1117.

SUMMARY OF THE INVENTION

In order to reuse a bond substrate while the quality of an SOI substrate is maintained, crystal defects due to oxide precipitate in a manufacturing process of the SOI substrate need to be eliminated as reprocessing treatment of the bond substrate. In Patent Documents 3 and 4, heat treatment at a high temperature of 1150° C. or higher is performed to eliminate such crystal defects. Thus, the heat treatment at high temperature is repeatedly performed on the bond substrate, and accordingly, the bond substrate is likely to be damaged as the number of times of use is increased. Further, heat treatment at high temperature takes 24 hours or longer in some cases, including the time for putting a substrate in a furnace and increasing the temperature of the substrate to a certain temperature, and cooling time for taking out the substrate from the furnace.

Therefore, this specification discloses a technique to reduce the number of times of heat treatment of a bond substrate in reprocessing treatment.

One embodiment of the present invention disclosed in this specification is a method for manufacturing an SOI substrate including the following steps: a first step of performing first heat treatment on a first semiconductor wafer at 1100° C. or higher under a non-oxidizing atmosphere to form a second semiconductor wafer; a second step of forming an insulating layer on a surface of the second semiconductor wafer and forming an embrittlement region in the second semiconductor wafer by irradiation with accelerated ions; a third step of attaching the second semiconductor wafer and a base substrate to each other with the insulating layer interposed therebetween; and a fourth step of performing second heat treatment on the second semiconductor wafer to divide the second semiconductor wafer at the embrittlement region, thereby forming a semiconductor layer fixed to the base substrate with the insulating layer interposed therebetween and a third semiconductor wafer from which the semiconductor layer is separated.

In the above embodiment, the non-oxidizing atmosphere is a rare gas atmosphere, a hydrogen gas atmosphere, or a mixed atmosphere of a rare gas and a hydrogen gas. As the rare gas, argon and helium are typically given. Further, a mixed gas atmosphere of oxygen and nitrogen may be used instead of the non-oxidizing atmosphere.

The oxygen concentration of the semiconductor wafer is preferably $2 \times 10^{18}$ atoms/cm$^3$ or lower.

Note that the present invention disclosed in this specification is not limited to the description in the embodiment, examples, and drawings, and it is apparent to those skilled in the art that modes and details can be modified in various ways without departing from the spirit of the present invention disclosed in this specification and the like.

When a semiconductor wafer is subjected to heat treatment at 1100° C. or higher under a non-oxidizing atmosphere such as an argon gas atmosphere or a mixed gas atmosphere of oxygen and nitrogen before an SOI substrate is manufactured, heat treatment at a high temperature of 1100° C. or higher does not need to be performed in reprocessing treatment of the semiconductor wafer every time the reprocessing treatment is performed.

BRIEF DESCRIPTION OF THE DRAWINGS

In the accompanying drawings:

FIGS. 2A to 2H are cross-sectional views illustrating an example of a method for manufacturing an SOI substrate according to one embodiment of the present invention;

FIG. 7A: heat treatment for 2 hours, FIG. 7B: heat treatment for 8 hours, and FIG. 7C: heat treatment for 16 hours;

DETAILED DESCRIPTION OF THE INVENTION

Figure 1:
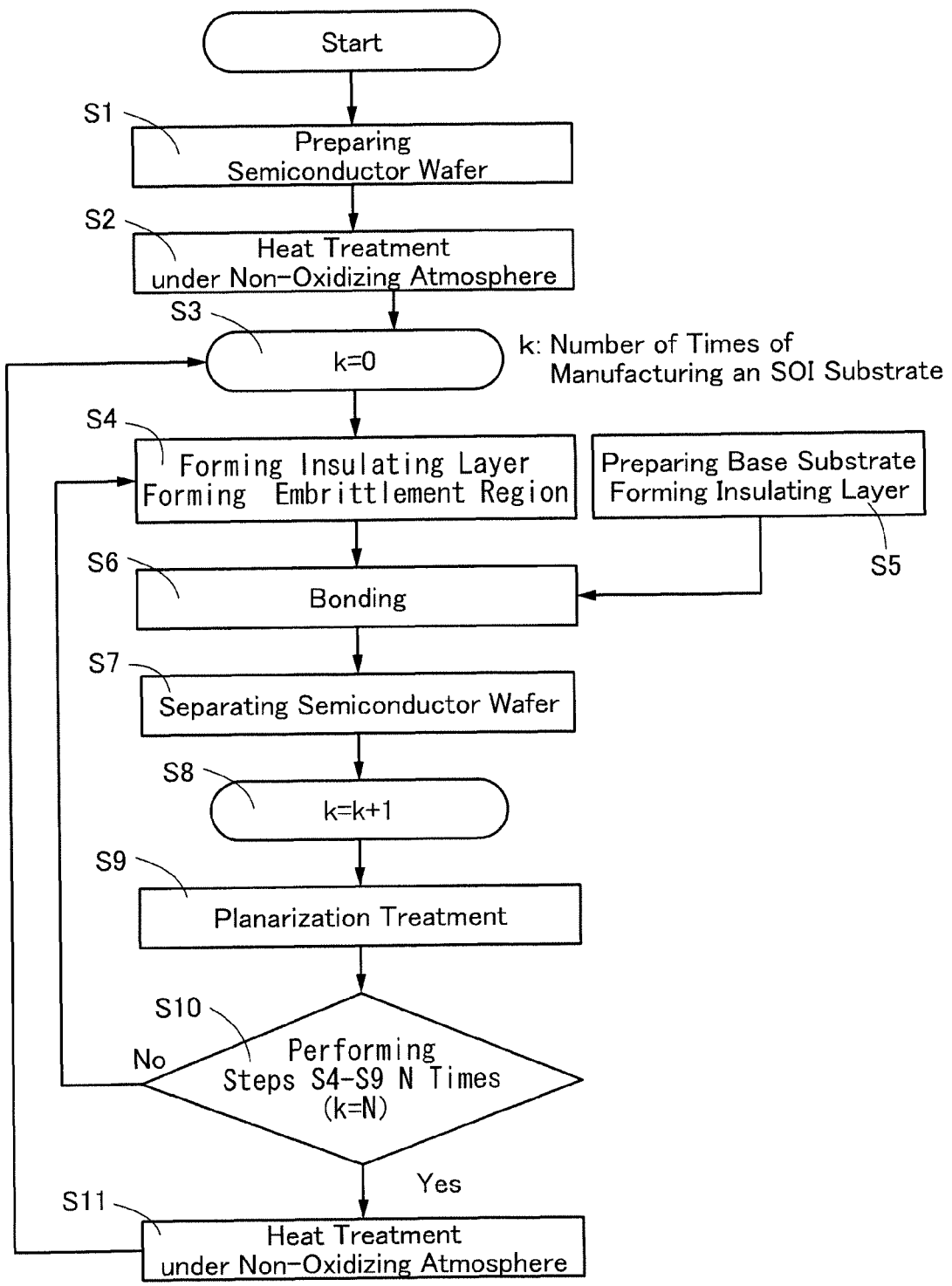
FIG. 1 is a flow chart illustrating an example of a method for manufacturing an SOI substrate according to one embodiment of the present invention.

An embodiment and examples of the invention disclosed in this specification will be described below with reference to the accompanying drawings. Note that in the drawings referred to in this specification, components denoted by the same reference numerals in different drawings represent the same components. Therefore, the description regarding such components, which are repetitive, will be omitted in some cases.

Here, a method for manufacturing an SOI substrate is described. In the method for manufacturing an SOI substrate of this embodiment, first, heat treatment is performed on a semiconductor wafer which is to be a bond substrate at 1100° C. or higher under a non-oxidizing atmosphere. After that, an insulating layer and an embrittlement region are provided for the semiconductor wafer. Then, the semiconductor wafer and a base substrate are attached to each other with the insulating layer interposed therebetween and the semiconductor wafer is divided at the embrittlement region, so that an SOI substrate including a semiconductor layer, the insulating layer, and the base substrate is formed.

Further, reprocessing treatment for reusing the semiconductor wafer after the division is also described here. In this embodiment, the reprocessing treatment includes at least a step for planarizing a surface from which the semiconductor layer is separated. In addition, every time the semiconductor wafer is used N times (N is an integer of 2 or more) to manufacture an SOI substrate, the semiconductor wafer is subjected to heat treatment at 1100° C. or higher in addition to planarization treatment as the reprocessing treatment. That is, heat treatment at high temperature is performed once per N times in the reprocessing treatment, not every time the semiconductor wafer is reused.

<Flow Chart of Manufacturing Method of SOI Substrate>

FIG. 1 is a flow chart illustrating an example of a method for manufacturing an SOI substrate of this embodiment and including a reprocessing treatment step in the case where a semiconductor wafer is repeatedly used as a bond substrate.

First, a bulk semiconductor wafer which is to be a bond substrate is prepared as illustrated in Step S1. As the semiconductor wafer, a semiconductor wafer formed using an element belonging to Group 14 of the periodic table, such as a silicon wafer, a germanium wafer, or a silicon germanium wafer can be used. In order to form a high-performance integrated circuit using an SOI substrate, a single crystal semiconductor wafer is preferably used. Alternatively, a floating zone (FZ) semiconductor wafer obtained by slicing an ingot formed by an FZ method or a Czochralski (CZ) semiconductor wafer obtained by slicing an ingot formed by a CZ method can be used. The CZ semiconductor wafer includes a magnetic field applied CZ (MCZ) semiconductor wafer obtained by slicing an ingot formed by an MCZ method. An MCZ method, which is one kind of CZ methods, is a method in which a magnetic field is applied to a melt of a semiconductor to suppress the convection of the melt so that crystal growth of the semiconductor is controlled.

Before an SOI substrate manufacturing process (Steps S4 to S7) is performed on the semiconductor wafer, heat treatment is performed on the semiconductor wafer under a non-oxidizing atmosphere (Step S2). This heat treatment is performed for outward diffusion of oxygen in the semiconductor wafer and formation of a zero defect layer (a DZ, a denuted zone) in the vicinity of the surface. Further, through this heat treatment, oxygen supersaturated inside the semiconductor wafer is separated out as an oxide, and minuted crystal defects are formed. Such minute defects due to oxide precipitate are called bulk micro defects (BMDs). BMDs formed inside the semiconductor wafer can function as gettering sinks for gettering metal elements in the manufacturing process of an SOI substrate.

Note that in this specification, a DZ means a region without BMDs, not a completely zero defect layer.

The heat treatment temperature in Step S2 is a temperature at which the outward diffusion of oxygen occurs, and is preferably 1100° C. or higher, more preferably 1200° C. or higher. The upper limit of the heat treatment temperature is a temperature at which the semiconductor wafer does not change its shape. In consideration of the melting point of silicon 1400° C., the heat treatment temperature is preferably higher than or equal to 1100° C. and lower than or equal to 1300° C., more preferably higher than or equal to 1200° C. and lower than or equal to 1300° C.

This heat treatment can be performed in a batch-type heating furnace (including a diffusion furnace or the like). Batch-type heating furnaces can process a plurality of substrates at a time and have high temperature controllability. The treatment time in the heating furnace (time at which the temperature of the object to be processed is maintained at a process temperature) is at least 1 hour. This is because when the heating time is short, outward diffusion of oxygen is not sufficiently performed and the oxygen concentration in the vicinity of the surface of the semiconductor wafer becomes high. In consideration of effects of the heat treatment and productivity, the process time is preferably 1 hour to 24 hours inclusive, more preferably 6 hours to 20 hours inclusive.

In addition, the non-oxidizing atmosphere is an atmosphere in which an oxide film is prevented from growing on the semiconductor wafer by heat treatment and may be an atmosphere of hydrogen gas and/or a rare gas. Specifically, a hydrogen atmosphere (the proportion of the hydrogen is 100%), a rare gas atmosphere (the proportion of the rare gas is 100%), a mixed gas atmosphere of a hydrogen gas and a rare gas. The rare gas is typically He or Ar. Further, in terms of cost, safety, and controllability of the atmosphere, the non-oxidizing atmosphere is preferably an Ar gas atmosphere (the proportion of the Ar is 100%).

In Step S2, a mixed gas atmosphere of $N_2$ and $O_2$ can be used instead of the non-oxidizing atmosphere. In this case, an atmosphere containing $O_2$ at 1 volume % to 10 volume % with respect to $N_2$ is preferably used. The reason why a non-oxidizing atmosphere made of a nitrogen gas (the proportion of the nitrogen is 100%) is not employed is that when heat treatment at 1100° C. or higher is performed on a semiconductor wafer such as a silicon wafer under a nitrogen gas atmosphere (the proportion of the nitrogen is 100%), a surface of the semiconductor wafer is roughened. Therefore, by mixing an oxygen gas to a nitrogen gas, an oxide is formed in the semiconductor wafer and the surface thereof is protected.

In Step S2, this heat treatment is performed on a new semiconductor wafer, whereby heat treatment at high temperature does not need to be performed on the semiconductor wafer every time the wafer is reused. Thus, the number of times of heat treatment at high temperature is reduced, which can suppress reduction in a mechanical strength of the semiconductor wafer. Therefore, by Step S2, cost reduction in manufacturing an SOI substrate and improvement in productivity can be achieved.

In addition, by performing heat treatment of Step S2, a semiconductor layer of the SOI substrate can be formed using a DZ in which oxygen is reduced more than that in an initial semiconductor wafer. Since generation of BMDs in the semiconductor layer is suppressed during a manufacturing process of a semiconductor device such as a transistor using an SOI substrate, a semiconductor device with high reliability can be manufactured.

Note that in order to form a DZ in a surface region of the semiconductor wafer reliably in Step S2, a semiconductor wafer which has an oxygen concentration of $2 \times 10^{18}$ atoms/$cm^3$ or lower is preferably prepared in Step S1. As such a semiconductor wafer, for example, a commercial CZ single crystal silicon wafer is given.

By reducing the oxygen concentration of the semiconductor wafer, generation of crystal defects due to oxygen in the vicinity of the surface of the semiconductor wafer is suppressed; therefore, a DZ can be formed reliably in Step S2 and the DZ can be made thick easily. Reliable formation of the DZ leads to improvement of the yield of the SOI substrate. In addition, to make the DZ thick leads to reduction in the number of times of heat treatment at high temperature for reprocessing treatment with respect to the number of times of reusing the semiconductor wafer, and shortening of the process time.

Further, by repeatedly performing heat treatment on the semiconductor wafer, BMDs in the semiconductor wafer grow to be crystal defects such as dislocation or stacking fault in some eases. Reduction in the oxygen concentration of the semiconductor wafer can suppress generation of crystal defects due to the BMDs, which leads to an increase in the number of times of use of the semiconductor wafer and improvement in the quality of the semiconductor layer of the SOI substrate, and the like.

For these reasons, a semiconductor wafer having an oxygen concentration of $2 \times 10^{18}$ atoms/$cm^3$ or lower is preferably prepared in Step S1. Further, it is preferable that the oxygen concentration of the semiconductor wafer be $1.8 \times 10^{18}$ atoms/$cm^3$ or lower, more preferably $1.4 \times 10^{18}$ atoms/$cm^3$ or lower. As a semiconductor wafer having an oxygen concentration of $1.4 \times 10^{18}$ atoms/$cm^3$ or lower, for example, an MCZ single crystal silicon wafer is given.

The oxygen concentration of the semiconductor wafer can be measured by secondary ion mass spectrometry (SIMS) or an infrared absorption spectroscopy. In this specification, the oxygen concentration of the semiconductor wafer is measured by the infrared absorption spectroscopy. The infrared absorption spectroscopy is a method by which the oxygen concentration of the whole semiconductor wafer can be measured without destruction. In the case where a single crystal silicon wafer is used, the following formulae (1) and (2) are used to calculate an oxygen concentration $O_{conc}$ using the measured infrared absorption spectrum.

$$I = I_0 \exp(-\alpha_1 t) \tag{1}$$

$$O_{conc} = \alpha_1 \times K \tag{2}$$

In the formula (1), I is the transmittance of a background of the infrared absorption spectrum; $I_0$ is the transmittance of the peak that appears at around 1106 cm$^{-1}$ (9.1 μm); $\alpha_1$ is the absorption coefficient at the same peak; and t is the thickness of the single crystal silicon wafer. In the formula (2), K is a constant. Here, as the constant K, $4.81 \times 10^{17}$ [cm$^{-2}$] (ASTM-121) which is a value standardized by American Society for Testing Materials (ASTM) is used.

The absorption coefficient $\alpha_1$ is calculated by the formula (1). When the absorption coefficient $\alpha_1$ is multiplied by the constant K as shown in the formula (2), the oxygen concentration $O_{conc}$ can be obtained. Note that in the case where a sample used as a reference for removing the influence of the background of the infrared absorption spectrum is air, $\alpha_2 = \alpha_1 - 0.4$ [cm$^{-1}$] is substituted for $\alpha_1$ to obtain the oxygen concentration $O_{conc}$.

Next, the first manufacturing process of an SOI substrate is conducted. Steps S4 to S7 are the manufacturing process of an SOI substrate. In the flow chart of FIG. 1, k represents the number of times of the manufacturing process of an SOI substrate using the semiconductor wafer which is prepared in Steps S1 and S2; thus, in Step S4 after Step S2 is performed, k=0 (Step S3). In FIG. 1, heat treatment is performed on the semiconductor wafer as reprocessing treatment once per N times (N is an integer of 2 or more) the manufacturing processes of an SOI substrate are performed, and crystal defects in the vicinity of the surface of the semiconductor wafer are reduced.

Step S4 is treatment for the semiconductor wafer and a step of providing an insulating layer and an embrittlement region for the semiconductor wafer.

The insulating layer is formed at least on a surface of the semiconductor wafer to be attached to a base substrate. This insulating layer may be a single layer or a plurality of layers. As a layer which forms the insulating layer, for example, a silicon oxide layer, a silicon nitride layer, a silicon oxynitride layer, a silicon nitride oxide layer, or the like can be formed. Further, the insulating layer can be formed by a chemical vapor deposition (CVD) method, a sputtering method, or an atomic layer epitaxy (ALE) method. Furthermore, by oxidation treatment and/or nitridation treatment on the semiconductor wafer, the layer which forms the insulating layer can be formed.

The embrittlement region can be formed by irradiating the semiconductor wafer with ions having kinetic energy. An ion implantation apparatus or an ion doping apparatus can be used for the formation of the embrittlement region.

There is no limitation on the order of the formation of the insulating layer and the embrittlement region in Step S4. Note that in order to prevent the contamination by metal in forming the embrittlement region, ion irradiation is preferably performed after at least one layer of an insulating layer is formed. An embrittlement region may be formed in such a manner, for example: the semiconductor wafer is subjected to thermal oxidation in an atmosphere containing HCl and oxygen to form a silicon oxide layer over the semiconductor wafer, and then the semiconductor wafer is irradiated with hydrogen ions through the silicon oxide layer. After the embrittlement region is formed, a second layer of the insulating layer such as a silicon oxynitride layer may be formed over the silicon oxide layer by a CVD method or the like.

A base substrate is prepared (Step S5). A substrate formed of an insulator or a bulk semiconductor wafer can be used for the base substrate. As the substrate formed of an insulator, a glass substrate, a quartz substrate, a ceramic substrate, a sapphire substrate, or the like is given. Note that as a material of the glass substrate, aluminosilicate glass, aluminoborosilicate glass, barium borosilicate glass, or the like is given. As the semiconductor wafer which is applied to the base substrate, for example, a semiconductor wafer formed using an element belonging to Group 14 of the periodic table, such as a silicon wafer, a germanium substrate, or a silicon germanium substrate can be used. Needless to say, a substrate which can withstand a process temperature of the manufacturing process of an SOI substrate is selected for the base substrate.

Note that in this specification, an oxynitride is a substance with a composition in which the number of oxygen atoms is more than the number of nitrogen atoms, and a nitride oxide is a substance with a composition in which the number of nitrogen atoms is more than the number of oxygen atoms.

In Step S5, an insulating layer having a single layer or a plurality of layers is formed over the base substrate as necessary. For example, a silicon oxide layer, a silicon nitride layer, a silicon oxynitride layer, a silicon nitride oxide layer, or the like can be formed as a layer which forms the insulating layer. Further, the insulating layer can be formed by a chemical vapor deposition (CVD) method, a sputtering method, or an atomic layer epitaxy (ALE) method. In the case where a semiconductor wafer is used for the base substrate, a layer which forms the insulating layer can be formed by a method in which the semiconductor wafer is oxidized or nitrided, or the like.

Note that there is no limitation on the order of Steps S4 and S5 in the flow chart of FIG. 1.

Next, the base substrate and the semiconductor wafer are attached to each other (Step S6). In the case where the insulating layer is not formed over the base substrate, a surface of the base substrate and a surface of the insulating layer over the semiconductor wafer are in contact with each other and pressure is applied thereto, so that the base substrate and the insulating layer are attached to each other. In the case where the insulating layer is formed over the base substrate, a surface of the insulating layer over the base substrate and the surface of the insulating layer over the semiconductor wafer are attached to each other. Note that in Step S6, a plurality of semiconductor wafers may be attached to one base substrate.

Next, Step S7 is conducted. Step S7 is a step in which heat treatment is performed to divide the semiconductor wafer at the embrittlement region. In this process, an SOI substrate including the semiconductor layer, the insulating layer, and the base substrate is formed. The heat treatment in Step S7 can be performed in an RTA apparatus, a heating furnace, or an irradiation apparatus which generates an electromagnetic wave having a frequency band of 300 MHz to 300 GHz (in specific, a microwave irradiation apparatus, or a millimeter wave irradiation apparatus).

Through the above steps, the first manufacturing process of an SOI substrate is completed. That is, k=1 in Step S8.

Next, reprocessing treatment is performed to reuse the semiconductor wafer which is divided in Step S7. In FIG. 1, as the reprocessing treatment, two treatments are described, planarization treatment (Step S9) for planarizing the surface of the semiconductor wafer and heat treatment (Step S11) for reducing crystal defects in the semiconductor wafer.

Since heat treatment in Step S2 is performed on the semiconductor wafer before the first manufacturing process of an SOI substrate is conducted, crystal defects due to a default of the SOI substrate do not exist in the vicinity of the surface of the semiconductor wafer; therefore, heat treatment at high temperature for reducing defects is not necessarily performed as the reprocessing treatment.

Consequently, as illustrated in Step S10, after the planarization treatment in Step S9 is performed, the second manufacturing process of an SOI substrate (S4 to S7) is conducted without the heat treatment in Step S11.

Polishing treatment such as chemical mechanical polishing (CMP), etching treatment such as wet etching, or laser beam irradiation treatment is given for the planarization treatment in Step S9. In Step S9, one or more treatments can be performed, and at least polishing treatment is preferably performed.

Next, with the use of the semiconductor wafer which is planarized in Step S9, the second manufacturing process of an SOI substrate (S4 to S7) is conducted. The reprocessing treatment (Step S9) and the manufacturing process of an SOI substrate (Steps S4 to S7) are repeatedly conducted until the number of times of the manufacturing process of an SOI substrate reaches N, as illustrated in FIG. 1.

When the number of times of performing Steps S4 to S7 reaches N (k=N) in Step S10, after the planarization treatment (Step S9) is performed, heat treatment is performed under a non-oxidizing atmosphere (Step S11).

The heat treatment in Step S11 is heat treatment for eliminating crystal defects (BMDs) due to oxide precipitate in the semiconductor wafer. By repeatedly performing Steps S4 to S9, BMDs are generated inside the semiconductor wafer and the thickness of the semiconductor wafer is gradually reduced. Therefore, when Steps S4 to S9 are repeatedly performed, the vicinity of the surface of the semiconductor wafer cannot be used as a semiconductor layer of an SOI substrate because of an increase in crystal defects.

For this reason, in Step S11, heat treatment is performed on the semiconductor wafer at 1100° C. or higher under a non-oxidizing atmosphere. This heat treatment is performed under conditions that outward diffusion of oxygen in the semiconductor wafer is performed, and can be performed in a manner similar to Step S2. The description of Step S2 is referred for the heat treatment in Step S11. Note that conditions of the heat treatment in Step S2 and conditions of the heat treatment in Step S11 are not necessarily the same in the flow chart of FIG. 1. Further, Step S11 is performed a plurality of times; however, conditions of the heat treatments do not need to be the same.

After Step S11 is performed, the process returns to Step S3. Then, the number of times of the manufacturing process of an SOI substrate k is reset to zero. After Steps S4 to S9 are performed N times, the heat treatment in Step S11 is conducted. As long as the semiconductor wafer can be reused, Steps S3 to S11 are repeatedly performed.

Note that in the flow chart of FIG. 1, the heat treatment for reprocessing the semiconductor wafer (Step S11) is performed after the manufacturing process of an SOI substrate is performed N times; however, the value of N may be different every time Step S11 is conducted. For example, after the manufacturing process of an SOI substrate is performed 6 times, heat treatment in the first Step S11 can be performed, and then after the manufacturing process of an SOI substrate is performed 4 times, heat treatment in the second Step S11 can be performed.

Figure 8:
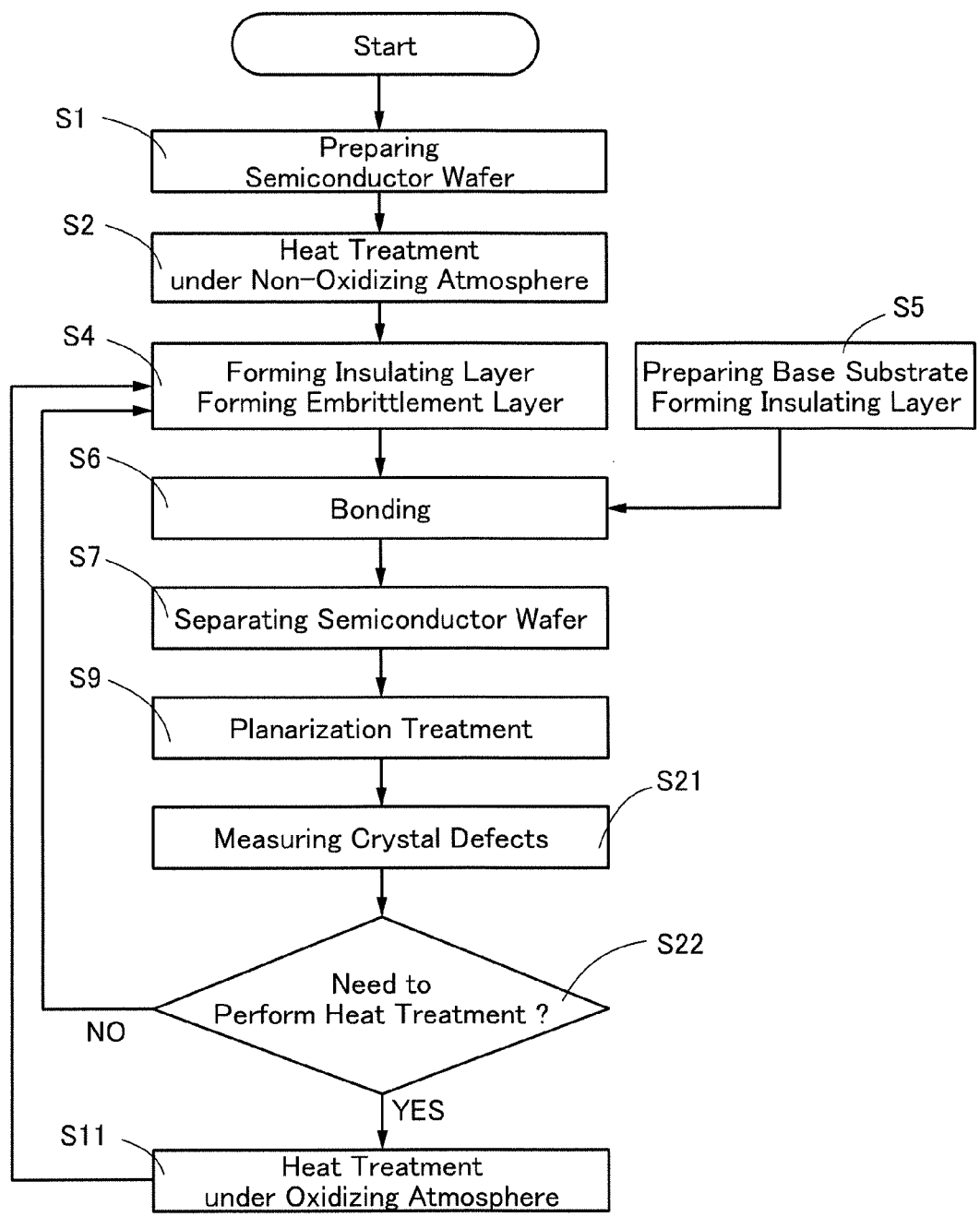
FIG. 8 is a flow chart illustrating an example of a method for manufacturing an SOI substrate according to one embodiment of the present invention.

In order to determine whether or not the heat treatment in Step S11 is performed, after the planarization treatment in Step S9 is performed, crystal defects in the semiconductor wafer may be measured. In this embodiment, effects of heat treatment at high temperature performed before the manufacturing process of an SOI substrate will be described. FIG. 8 is a flow chart illustrating an example of such a method for manufacturing an SOI substrate.

By repeatedly performing Steps S4 to S7, BMDs are generated inside the bond substrate (semiconductor wafer) and the thickness of the bond substrate is gradually reduced. Accordingly, crystal defects in the vicinity of the surface of the bond substrate are increased and the crystallinity is deteriorated as much as the vicinity of the surface of the bond substrate cannot be used as the semiconductor layer of the SOI substrate.

On the other hand, the semiconductor wafer used for the bond substrate is usually obtained by slicing a semiconductor ingot. As a result, even when the semiconductor wafers are manufactured using the same semiconductor ingot, the oxygen concentration distributions are different for each semiconductor wafer. Accordingly, even when heat treatment at high temperature is performed on a plurality of semiconductor wafers under the same conditions, the generation density and the distribution profile of each of oxide precipitate and crystal defects formed in the semiconductor wafer are different for each semiconductor wafer. Therefore, even when manufacturing processes of SOI substrates (Steps S4 to S7) are performed under the same conditions, the timing at which heat treatment as the reprocessing treatment is performed is different for each semiconductor wafer.

For the above reasons, in order to perform the heat treatment at a proper timing, crystal defects in the semiconductor wafer which is subjected to planarization treatment are measured. With the use of the measurement results, the semiconductor wafer is checked and whether or not the heat treatment as the reprocessing treatment is performed on the semiconductor wafer is determined. When the semiconductor wafer is judged to be defective, crystal defects in the vicinity of the surface of the semiconductor wafer are reduced by the heat treatment, and then the semiconductor wafer is reused.

As illustrated in FIG. 8, after the planarization treatment in Step S9 is conducted, crystal defects in the semiconductor wafer are measured as Step S21. Step S22 is a step of determining the crystallinity of the semiconductor wafer based on the measurement results in Step S21. When the crystallinity of the semiconductor wafer is judged not to be defective in Step S22, the semiconductor wafer is reused as the semiconductor wafer in Step S4 without the heat treatment at high temperature in Step S11. On the other hand, the semiconductor wafer judged to be defective is subjected to the heat treatment at high temperature in Step S11 to reduce the crystal defects in the vicinity of the surface of the semiconductor wafer, and then the semiconductor wafer is reused as the semiconductor wafer in Step S4.

A method for measuring crystal defects in the semiconductor wafer in Step S21 may be a method for evaluating the crystal defects in the semiconductor wafer without destruction. For example, an infrared light absorption spectroscopy, an infrared light interference method, Raman spectroscopy, a cathode luminescence method, a photoluminescence method, or a microwave photoconductivity decay method is employed. The microwave photoconductivity decay (µ-PCD) method is a method for measuring a lifetime reflecting a state of crystals which are measurement samples using a time change in the reflectivity of a microwave, without destruction.

In Step S22, the semiconductor wafer is checked based on the measurement results in Step S21, and whether or not the heat treatment in Step S11 is performed is determined.

In the method for manufacturing an SOI substrate in FIG. 8, whether or not the heat treatment as the reprocessing treatment (Step S11) is performed can be determined for each semiconductor wafer; therefore, the quality of the SOI substrate can be maintained more easily than in the manufacturing method in FIG. 1.

Next, two examples of a manufacturing process of an SOI substrate are described using cross-sectional views. Although two manufacturing examples are described below with reference to the flow chart of FIG. 1, these manufacturing examples can also be applied to the flow chart of FIG. 8.

<Manufacturing Method Example 2>

An example of the method for manufacturing an SOI substrate is described with reference to FIGS. 2A to 2H.

FIG. 2A is a cross-sectional view illustrating steps corresponding to Steps S1 and S2 in FIG. 1. In this manufacturing example, a new single crystal silicon wafer (called a silicon wafer) is used as the bond substrate. Heat treatment is performed on the single crystal silicon wafer at higher than or equal to 1100° C. and lower than or equal to 1300° C. under a non-oxidizing atmosphere. Here, the silicon wafer is heated at 1200° C. for 2 hours using a vertical diffusion furnace. The atmosphere of the heat treatment is an argon gas atmosphere (the proportion of the argon is 100%). FIG. 2A illustrates a silicon wafer 100 after the heat treatment.

When the new silicon wafer is subjected to this heat treatment, the silicon wafer can be repeatedly used without heat treatment at high temperature as reprocessing treatment. The number of reuse times without heat treatment at high temperature depends on temperature and time of the heat treatment, conditions of polishing treatment in the reprocessing treatment, or the like; however, when the amount of polishing is 6 μm or lower in the heat treatment at high temperature under the above conditions, a commercial CZ single crystal silicon wafer can be used at least three times without the heat treatment at high temperature in Step S11 in FIG. 1.

After the heat treatment is finished, an insulating layer is formed over the silicon wafer 100 as illustrated in FIG. 2B. Here, the silicon wafer 100 is thermally oxidized to form a silicon oxide layer 110. The thermal oxidation treatment may be dry oxidation and is preferably performed under an atmosphere in which a halogen gas or a halogen compound gas is added to an $O_2$ gas. As such a gas, a kind or plural kinds of gases selected from HCl, HF, $NF_3$, HBr, $Cl_2$, $ClF_3$, $BCl_3$, $F_2$, $Br_2$, and the like can be used.

For example, heat treatment is performed at higher than or equal to 900° C. and lower than or equal to 1100° C. under an atmosphere containing HCl at 0.5 volume % to 10 volume % with respect to $O_2$, so that a silicon oxide layer 110 containing chlorine can be formed. The treatment time can be 0.1 hour to 6 hours. In addition, the thickness of the silicon oxide layer 110 can be 50 nm to 200 nm. Here, the heat treatment is performed on the silicon wafer 100 at 950° C. under an $O_2$ gas atmosphere containing HCl at 3 volume %, whereby the silicon oxide layer 110 (thermal oxide layer) is formed to a thickness of 100 nm.

Next, as illustrated in FIG. 2C, irradiation with ions 120 is performed, so that an embrittlement region 111 is formed in the silicon wafer 100. An ion implantation apparatus or an ion doping apparatus can be used for the irradiation with the ions 120. In an ion implantation apparatus, a source gas is excited to generate ion species, the generated ion species are mass-separated, and an object to be processed is irradiated with the ion species having a predetermined mass. In an ion doping apparatus, a process gas is excited to generate ion species, the generated ion species are not mass-separated, and an object to be processed is irradiated with the generated ion species. Note that in an ion doping apparatus provided with a mass separator, ion irradiation with mass separation can also be performed as in the ion implantation apparatus.

Since the ions 120 are accelerated by an electric field and have kinetic energy, the embrittlement region 111 can be formed in a region at a predetermined depth from a surface of the silicon wafer 100 by the irradiation with the ions 120. The depth at which the embrittlement region 111 is formed can be controlled by acceleration energy of the ions 120 or the incidence angle thereof, and the embrittlement region 111 is formed in a region at the same depth or substantially the same depth as the average penetration depth of the ions 120. In addition, the depth at which the embrittlement region 111 is formed determines the thickness of a semiconductor layer to be separated from the silicon wafer 100. The depth at which the embrittlement region 111 is formed is greater than or equal to 30 nm and less than or equal to 1 μm from the surface of the silicon wafer 100, and is preferably greater than or equal to 50 nm and less than or equal to 300 nm.

A typical source gas of the ions 120 is a $H_2$ gas. As well as a $H_2$ gas, a rare gas such as helium or argon, a halogen gas typified by a fluorine gas or a chlorine gas, and a halogen compound gas such as a fluorine compound gas (e.g., $BF_3$) can be used. One or more kinds of gases can be used as the source gas.

The irradiation with the ions 120 can be performed a plurality of times to form the embrittlement region 111. In this case, different source gases may be used for the ion irradiation or the same source gas may be used for the ion irradiation. For example, after ion irradiation is performed using a rare gas as a source gas, ion irradiation can be performed using a gas containing hydrogen as a source gas. Alternatively, ion irradiation can be performed first using a halogen gas or a halogen compound gas, and then, ion irradiation can be performed using the gas containing hydrogen.

Here, an ion doping apparatus is used for the formation of the embrittlement region 111 and a $H_2$ gas is used as the source gas of the ions 120. For example, the silicon wafer 100 is irradiated with hydrogen ions through the silicon oxide layer 110 with an acceleration voltage of 50 kV at a dose of $2.7 \times 10^{16}$ ions/cm$^2$.

Next, a base substrate and the silicon wafer 100 are attached to each other as illustrated in FIG. 2D. Here, a glass substrate 200 is used as the base substrate. Instead of the glass substrate 200, a single crystal silicon wafer may be used similarly to the silicon wafer 100. Further, an insulating layer may be formed over the glass substrate 200 by a PECVD method or the like as illustrated in Step S5 in FIG. 1.

Before the attachment, the silicon wafer 100 and the glass substrate 200 are subjected to cleaning treatment to clean the surfaces to be attached. When the silicon wafer 100 and the glass substrate 200 are pressed with the surface of the glass substrate 200 and the surface of the silicon oxide layer 110 being in contact with each other, the glass substrate 200 and the silicon oxide layer 110 are bonded to each other, so that the glass substrate 200 and the silicon wafer 100 are attached to each other. Then, the glass substrate 200 and the silicon wafer 100 are subjected to heat treatment to increase the attachment strength. The heat treatment temperature needs to be a temperature at which separation does not proceed at the embrittlement region 111 and may be higher than or equal to 200° C. and lower than or equal to 300° C.

Next, as illustrated in FIG. 2E, the silicon wafer 100 is divided at the embrittlement region 111 and a single crystal silicon layer 113 is formed from the silicon wafer 100. Here, heat treatment is performed on the silicon wafer 100 which is fixed to the glass substrate 200 in a heating furnace. The heat treatment temperature is preferably 400° C. or higher and is limited by an allowable temperature limit of the glass substrate 200 (base substrate) or the like. A heating furnace or an RTA apparatus can be used for this heat treatment. The heat treatment is performed to generate a crack in the embrittlement region 111 and separate the silicon wafer 100 and the glass substrate 200 into a silicon wafer 101 and an SOI substrate including the single crystal silicon layer 113, the silicon oxide layer 110, and the glass substrate 200. The silicon wafer 101 is a wafer before the reprocessing treatment.

Here, a series of heat treatments, treatment for increasing the attachment strength between the glass substrate 200 and the silicon oxide layer 110 and treatment for dividing the silicon wafer 100, is performed in a heating furnace. Specifically, the silicon wafer 100 fixed to the glass substrate 200 is heated at 200° C. for 2 hours in the heating furnace, and then the temperature is raised to 600° C. and heating is performed for 2 hours.

Next, as illustrated in FIG. 2F, the single crystal silicon layer 113 of the SOI substrate is planarized to form a single crystal silicon layer 114. Here, since the base substrate of the SOI substrate is the glass substrate 200 having low heat resistance, it is difficult to perform planarization by heat treatment; therefore, the single crystal silicon layer 113 is irradiated with a laser beam as planarization treatment. Note that the single crystal silicon layer 113 may be etched as necessary before the laser beam irradiation treatment is performed. This etching treatment can remove the embrittlement region 111 left on a surface of the single crystal silicon layer 113.

Examples of a laser that is used for the laser beam irradiation treatment include an excimer laser such as a XeCl laser or a KrF laser and a gas laser such as an Ar laser or a Kr laser. Other examples that can be used are a solid-state laser such as a YAG laser, a $YVO_4$ laser, a YLF laser, a $YAlO_3$ laser, a $GdVO_4$ laser, a KGW laser, a KYW laser, or a $Y_2O_3$ laser. As the laser beam, the fundamental wave, a harmonic (such as a second harmonic, a third harmonic, or a fourth harmonic) of any of these lasers can be used. Note that some of these solid-state lasers can be either a continuous wave laser or a quasi-continuous wave laser even when using the same laser medium.

When the laser beam irradiation is performed, the single crystal silicon layer 113 absorbs a laser beam to be melted. When energy of the laser beam is not supplied to a melted region, the temperature is rapidly decreased and the melted region is solidified. As a result, a single crystal silicon layer 114 whose planarity is improved can be formed. Further, since crystals of the single crystal silicon layer 113 can be rearranged by the melting, dangling bonds and the like in the single crystal silicon layer 113 can be reduced. As described above, the single crystal silicon layer 114 whose planarity and crystallinity are improved is formed by the laser beam irradiation treatment.

However, BMDs in the single crystal silicon layer 113 are hardly eliminated by the laser beam irradiation treatment. Therefore, in the case where a base substrate with an allowable temperature limit of 1100° C. or lower is used, it is significantly effective to perform heat treatment at high temperature on the semiconductor wafer before an SOI substrate is manufactured in improvement of the quality of the SOI substrate. This is because when the allowable temperature limit of the base substrate is 1100° C. or lower, heat treatment cannot be performed at a temperature at which BMDs can be effectively eliminated from the semiconductor layer over the base substrate. In addition, there is no proper method which can be substituted for the heat treatment. For this reason, in the case where a base substrate with low heat resistance is used, it is required that the semiconductor layer which has as less oxide precipitate as possible is formed over the base substrate. Therefore, it is significantly effective to form a semiconductor layer from DZs whose oxygen concentration is reduced in improvement of the quality of the SOI substrate formed using the base substrate with low heat resistance. According to this embodiment, even when a base substrate whose allowable temperature limit is 700° C. or lower such as a glass substrate is used, an SOI substrate with high quality can be manufactured.

Further, a step of reducing the thickness of the single crystal silicon layer 114 of the SOI substrate in FIG. 2F may be conducted. Here, since the glass substrate 200 is used for the base substrate, dry etching and/or wet etching may be performed as treatment of reducing the thickness of the single crystal silicon layer 114. In the case where a semiconductor wafer is used for the base substrate, known treatment of reducing the thickness in which thermal oxidation treatment and etching treatment are combined may be performed.

Reprocessing treatment of the silicon wafer 101 from which the single crystal silicon layer 113 is separated in the step of FIG. 2E is described. The reprocessing treatment includes planarization treatment (FIG. 2G) and heat treatment at 1100° C. or higher under a non-oxidizing atmosphere (FIG. 2H). As illustrated in the flow chart of FIG. 1, the planarization treatment in FIG. 2G is performed every time the bond substrate is reprocessed. FIG. 2G shows a reprocessed silicon wafer 102 which is reprocessed by the planarization treatment. The reprocessed silicon wafer 102 is reused as the bond substrate (silicon wafer 100) in FIG. 2B.

In addition, the heat treatment in FIG. 2H is intermittently performed. The heat treatment is performed on the reprocessed silicon wafer 102 after the planarization treatment in FIG. 2G as the reprocessing treatment after the manufacturing process of an SOI substrate (in FIGS. 2B to 2E) is performed a plurality of times. A reprocessed silicon wafer 103 after the heat treatment is reused as the bond substrate (silicon wafer 100) in FIG. 2B.

The reprocessed silicon wafer 102 can be manufactured by the planarization treatment in FIG. 2G, for example, in the following manner. First, the silicon oxide layer 110 left on the silicon wafer 101 is removed by wet etching using buffered hydrofluoric acid. Next, a separation surface of the single crystal silicon layer 113 is polished with a CMP apparatus. Further, before the polishing using the CMP apparatus, etching may be performed using a Dash etchant, a Sato etchant, a mixed etchant of hydrofluoric acid and hydrogen peroxide water, or the like. Through this etching, a projected portion around the silicon wafer 101 (a portion which has not been attached to the glass substrate 200) can be removed, so that the amount of polishing with the CMP apparatus can be reduced.

Alternatively, in order to manufacture the reprocessed silicon wafer 103 by the heat treatment in FIG. 2H, for example, the silicon wafer 101 is heated at 1200° C. for 1 hour or longer under an argon gas atmosphere (the proportion of the argon is 100%) using a heating furnace, similarly to the heat treatment in FIG. 2A.

<Manufacturing Method Example 2>

Another example of the method for manufacturing an SOI substrate is described with reference to FIGS. 3A to 3E. In this manufacturing example, steps of forming an insulating layer and an embrittlement region different from the steps in FIG. 2B and FIG. 2C are described. The other steps can be conducted similarly to the manufacturing example 1.

Figure 3A:
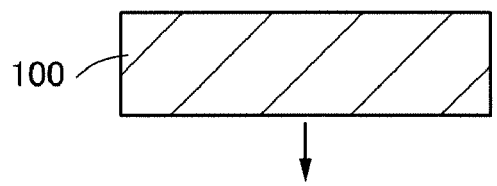
FIGS. 3A to 3E are cross-sectional views illustrating an example of a method for manufacturing an SOI substrate according to one embodiment of the present invention.
Figure 3B:
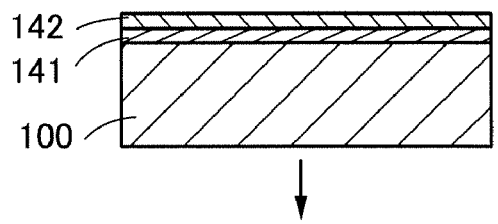

First, the silicon wafer 100 subjected to the heat treatment at high temperature is manufactured as illustrated in FIG. 3A. Next, the silicon wafer 100 is cleaned and an insulating layer is formed. Here, a silicon oxynitride layer 141 and a silicon nitride oxide layer 142 are successively formed with a PECVD apparatus as illustrated in FIG. 3B. $SiH_4$ and $N_2O$ are supplied to a chamber of the PECVD apparatus, and plasma of these process gases are generated, whereby the silicon oxynitride layer 141 is formed on a surface of the silicon wafer 100. Next, the gas introduced into the chamber is changed to SiH$_4$, N$_2$O, NH$_3$, and H$_2$. Plasma of a mixed gas of these is generated, and a silicon nitride oxide layer 142 is formed over the silicon oxynitride layer 141. The film formation temperatures of the silicon oxynitride layer 141 and the silicon nitride oxide layer 142 can be 300° C.

Note that a silicon oxide layer may be formed using an organosilane as a source gas with a PECVD apparatus instead of the silicon oxynitride layer 141. Alternatively, a silicon nitride layer may be formed using SiH$_4$, N$_2$, NH$_3$, and H$_2$ with a PECVD apparatus instead of the silicon nitride oxide layer 142.

Figure 3C:
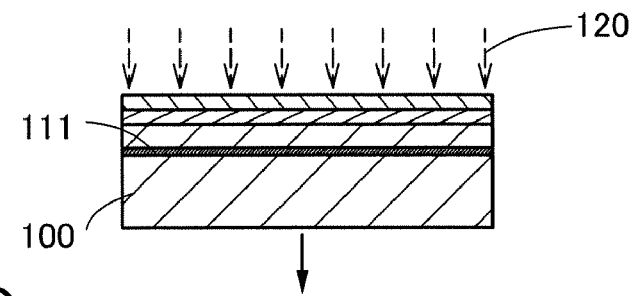

Next, as illustrated in FIG. 3C, irradiation with the ions 120 is performed to form the embrittlement region 111 in the silicon wafer 100. This step may be conducted similarly to the step in FIG. 2C.

Figure 3D:
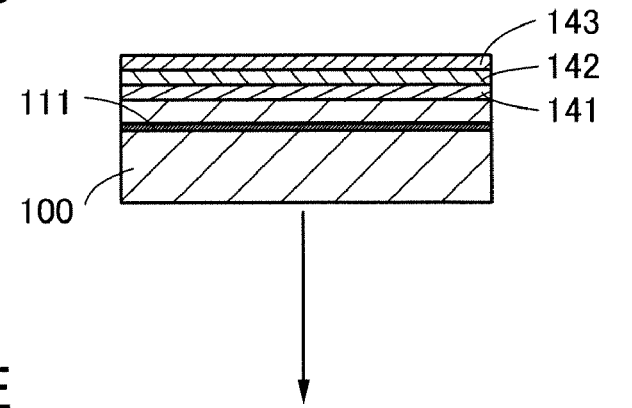
Figure 3E:
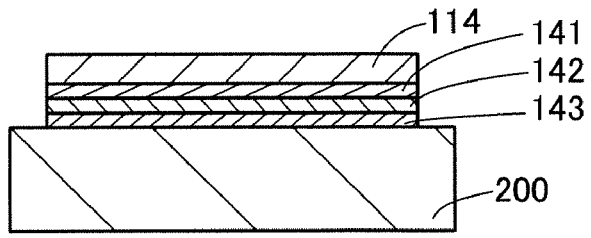

After the embrittlement region 111 is formed, a silicon oxide layer 143 is formed on a top surface of the silicon nitride oxide layer 142 as illustrated in FIG. 3D. Here, the silicon oxide layer 143 is formed using TEOS and O$_2$ at the film formation temperature of 300° C. with a PECVD apparatus. Note that the thickness of each insulating layer (141 to 143) can be 50 nm to 200 nm.

When subsequent steps are performed similarly to those in FIGS. 2D to 2F, an SOI substrate including the single crystal silicon layer 114 which is planarized, the insulating layer (141 to 143) having a three-layer structure, and the glass substrate 200 can be manufactured.

In this manufacturing example, the insulating layer formed over the semiconductor wafer is formed by performing a process at a process temperature which does not exceed 300° C. with a PECVD apparatus, not by thermal oxidation treatment; therefore, the number of times of heat treatment at high temperature on the semiconductor wafer can be reduced in comparison with the manufacturing example 1.

EXAMPLE

The utility of performing heat treatment before the manufacturing process of an SOI substrate will be described below. In the following examples, a single crystal silicon wafer was used for the semiconductor wafer and the method illustrated in FIGS. 2A to 2H was employed as the method for manufacturing an SOI substrate.

Example 1

In this example, an SOI substrate was manufactured using a new CZ single crystal silicon wafer (hereinafter called a CZ wafer) and crystal defects in the CZ wafer were observed at some times during the manufacturing process of the SOI substrate.
<Experimental Method>
(a1) Preparation of CZ Wafer A new CZ wafer (a p-type wafer of 5 square inches with a plane orientation (100) manufactured by SUMCO CORPORATION) was used. One CZ wafer was divided into four, and four CZ wafers of approximately 2 square inches were manufactured. These four CZ wafers are hereinafter referred to as wafers A1 to A4.
(a2) Heat Treatment Under Non-Oxidizing Atmosphere All wafers A1 to A4 were simultaneously subjected to heat treatment at 1200° C. for 8 hours under an Ar gas atmosphere (the proportion of the argon is 100%) in a heating furnace. The following steps were not performed on the wafer A1.

(a3) Thermal Oxidation Treatment (Formation of Insulating Layer)

The three wafers A2 to A4 were subjected to HCl thermal oxidation treatment at the same time, so that thermal oxide layers were formed. The heat treatment was performed at 950° C. for 3.5 hours under an O$_2$ gas atmosphere containing HCl at 3 volume %, so that the thermal oxide layers were each made to a thickness of approximately 100 nm. The following steps were not performed on the wafer A2.
(a4) Hydrogen Doping (Formation of Embrittlement Region)

Each of the wafers A3 and A4 was irradiated with hydrogen ions with an ion doping apparatus to form an embrittlement region. A H$_2$ gas (the proportion of the hydrogen is 100%) was excited, and the wafers A3 and A4 were irradiated with hydrogen ions with an acceleration voltage of 40 kV at a dose of $2.6 \times 10^{16}$ ions/cm$^2$. The following steps were not performed on the wafer A3.
(a5) Heat Treatment Next, the wafer A4 was subjected to heat treatment in a chamber of an LPCVD apparatus. This heat treatment was performed in a reduced-pressure chamber at 200° C. for 2 hours, and then at 600° C. for 2 hours. This heat treatment corresponds to the treatment for dividing a semiconductor wafer in FIG. 2E; however, since the wafer A4 was not attached to a base substrate, the wafer A4 was not divided at the embrittlement region in this heat treatment.

Figure 4:
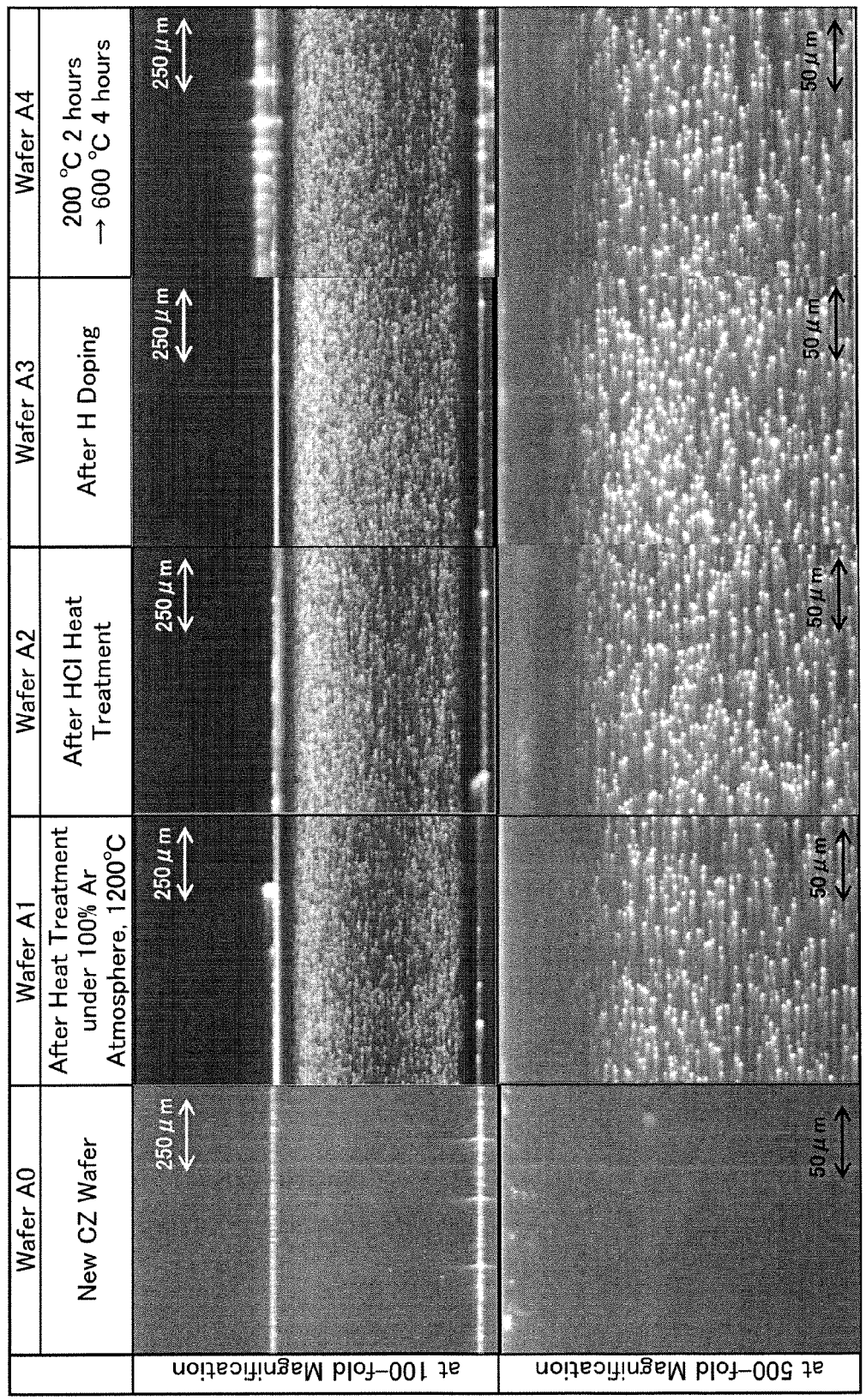
FIG. 4 is an image of cross-sections of CZ single crystal silicon wafers observed with an infrared laser scattering tomography apparatus.

Then, crystal defects in a depth direction of each of the wafers A1 to A4 and a new CZ wafer (hereinafter, referred to as a wafer A0) which is manufactured by SUMCO CORPORATION and is the same as the wafers A1 to A4 were evaluated. An IR-laser scattering tomography (IR-LST) was used for this evaluation, and the wafers A0 to A4 are cleaved and cleavage surfaces were photographed. FIG. 4 shows images observed with an IR-LST apparatus (hereinafter referred to as IR-LST images). The observation magnifications are 500 times and 100 times. The IR-LST is known as a method by which BMD distribution in a semiconductor wafer can be evaluated. Since crystal defects are light scatters, the crystal defects are luminescent spots (a bright image) in an IR-LST image. A region where crystal defects do not exist is a dark image (black image).

As illustrated in FIG. 4, when the wafer A1 and the wafer A0 are compared, it can be found that BMDs are formed inside the wafer A1 by heat treatment at high temperature which is performed on the new wafer. On the other hand, in the vicinity of a surface of the wafer A1, there are no BMDs and a zero defect layer (a DZ, a denuded zone) can be observed.

As described above, in this specification, a DZ does not mean a completely zero defect layer, but a region without BMDs. Specifically, a DZ can refer to a region where luminescent spots are not observed in the IR-LST image at 500-fold magnification as illustrated in FIG. 4. In Examples 1 to 3, such a region is regarded as a DZ.

When the IR-LST images of the wafers A1 to A4 in FIG. 4 are compared, it can be observed that the thicknesses (also referred to as widths or depths) of DZs are not significantly changed in the manufacturing process of an SOI substrate and the DZs formed in the heat treatment at high temperature in step a2 are not eliminated in the first manufacturing process of an SOI substrate. Accordingly, in the case where the wafer A4 is reused, heat treatment at high temperature for outward diffusion of oxygen is not necessarily performed as reprocessing treatment.

Example 2

In this example, the utility of performing heat treatment at high temperature before the manufacturing process of an SOI substrate will be described as in Example 1. Further, the influence of the oxygen concentration of a semiconductor wafer is also described. In this example, an MCZ single crystal silicon wafer (hereinafter, referred to as an MCZ wafer) which has a lower oxygen concentration than a CZ wafer is used. In manufacturing an ingot, since a surface of a quartz crucible which is in contact with a silicon melt is melted in a CZ method, oxygen is taken into the growing ingot. In an MCZ method, a magnetic field is applied to a melt to control the convection of the melt so that oxygen taken into the ingot is reduced.

<Experimental Method>

(b1) Preparation of MCZ Wafer

A new MCZ wafer (a p-type wafer of 5 square inches with a plane orientation (100) manufactured by SUMCO CORPORATION) was used.

(b2) Heat Treatment Under Non-Oxidizing Atmosphere

Under the same conditions as those of Example 1, heat treatment was performed at 1200° C. for 8 hours under an Ar gas atmosphere (the proportion of the argon is 100%) in a heating furnace.

(b3) Thermal Oxidation Treatment (Formation of Insulating Layer)

HCl thermal oxidation treatment was performed under the same conditions as those of Example 1. Heat treatment was performed at 950° C. for 3.5 hours under an $O_2$ gas atmosphere containing HCl at 3 volume %, so that a thermal oxide layer was formed to a thickness of approximately 100 nm.

(b4) Hydrogen Doping (Formation of Embrittlement Region)

With the use of an ion doping apparatus, the MCZ wafer was irradiated with hydrogen ions to form an embrittlement region. A $H_2$ gas (the proportion of the hydrogen is 100%) was excited, and the MCZ wafer was irradiated with hydrogen ions with an acceleration voltage of 50 kV at a dose of $2.5 \times 10^{16}$ ions/cm$^2$.

(b5) Heat Treatment (Division of Wafer)

After the MCZ wafer was attached to a glass substrate, the MCZ wafer was divided with an LPCVD apparatus under the same conditions as those of Example 1, so that an SOI substrate was manufactured. Heat treatment was performed at 200° C. for 2 hours, and then performed at 600° C. for 2 hours.

(b6) Laser Irradiation Treatment (Planarization of Single Crystal Silicon Layer)

In order to planarize a single crystal silicon layer of the SOI substrate manufactured in step b5, the single crystal silicon layer was irradiated with a laser beam. A XeCl excimer laser was used for the laser. The laser beam had a wavelength of 308 nm, a pulse width of 25 nanoseconds, and a repetition rate of 30 Hz. Further, while a $N_2$ gas (the proportion of the nitrogen is 100%) was sprayed on a region to be irradiated with the laser beam, a linear laser beam was scanned and the single crystal semiconductor layer was irradiated with the laser beam.

(b7) Polishing Treatment (Reprocessing of Wafer)

In order to reuse the MCZ wafer which was divided in step b5, a thermal oxide layer was removed by wet etching with buffered hydrofluoric acid, and then the MCZ wafer was subjected to treatment with a Dash etchant. The surface where the single crystal silicon layer was separated was polished with a CMP apparatus.

(b8) Reuse of Wafer

The polishing treatment and the manufacturing process of an SOI substrate were repeatedly performed, so that a plurality of SOI substrates were manufactured using one MCZ wafer. In this example, three MCZ wafers were prepared and the manufacturing process of an SOI substrate was performed four times on each of the wafers. The 12 substrates which were manufactured in this step are referred to as SOI substrates B.

<Comparison Experiment>

As a comparative example, an SOI substrate was manufactured using an MCZ wafer without the heat treatment at high temperature in step b2. The other steps were performed under the same conditions as those of the above SOI substrate B. In the comparison experiment, two MCZ wafers were prepared and four SOI substrates were manufactured using each of the two MCZ wafers. The SOI substrate of the comparative example is referred to as an SOI substrate X.

<Evaluation Method 1>

A surface of a single crystal silicon layer (hereinafter referred to as a silicon layer) of each of the SOI substrate B and the SOI substrate X was observed with an optical microscope to evaluate the crystallinity of the silicon layer. This is because by evaluating the crystallinity of the silicon layer, the number of times an MCZ wafer can be reused can be found. Specifically, the surface of the silicon layer was observed with an optical microscope at 200-fold magnification in a dark-field mode and the number of luminescent spots was counted visually by an observer. From the experience of the present inventors, when the size of a luminescent spot is approximately 0.5 μm at 200-fold magnification, the spot can be seen by a human. The luminescent spot is a scattering object due to a crystal defect or dust. It was confirmed that oxide precipitate and dislocation (a crystal defect) were observed as luminescent spots with an optical microscope by cross-sectional observation of the silicon layers with a scanning transmission electron microscope (STEM). Therefore, the quality of an MCZ wafer can be determined by the number of luminescent spots.

Figure 5A:
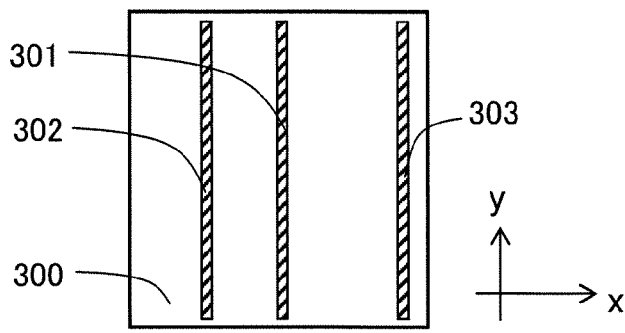
FIG. 5A is a top view of an SOI substrate illustrating a region observed with an optical microscope.

FIG. 5A illustrates a region where the number of luminescent spots was counted. FIG. 5A is a top view of an SOI substrate 300. In the SOI substrate 300, the number of luminescent spots was counted in three linear regions 301 to 303 each of which has a length Lx in an x-axis direction of 1.25 mm and a length Ly in a y-axis direction of 107 mm. When the coordinates of the center of the SOI substrate 300 are (x, y)=(0 mm, 0 mm), the x coordinate of the center of the region 301 is 0 mm, the x coordinate of the center of the region 302 is −31.75 mm, and the x coordinate of the center of the region 303 is 53.1 mm.

Figure 5B:
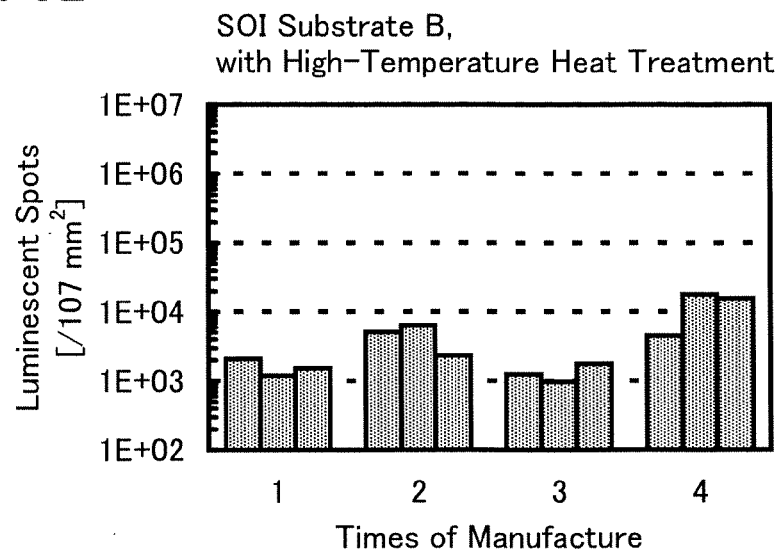
FIG. 5B is a graph showing the number of luminescent spots in a dark-field image of a single crystal silicon layer of an SOI substrate, observed with an optical microscope, with respect to the number of times of manufacture of the SOI substrate.
Figure 5C:
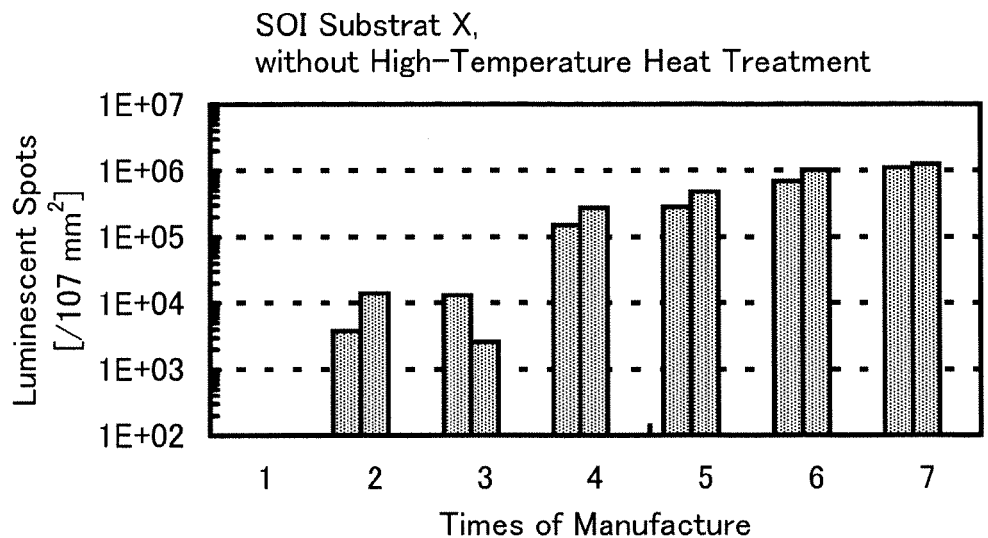
FIG. 5C is the same graph as FIG. 5B, regarding a comparative example.

FIGS. 5B and 5C show the calculation results of the number of luminescent spots. FIG. 5B shows data of the SOI substrate B and FIG. 5C shows data of the SOI substrate X. In each of FIG. 5B and FIG. 5C, the horizontal axis indicates the number of times of a manufacturing process of an SOI substrate which corresponds to the number of times of use of a new MCZ wafer. The vertical axis indicates the number of luminescent spots in a dark-field image, and the number of luminescent spots is a value obtained by converting the number of luminescent spots in the three regions 301 to 303 in FIG. 5A to the number of luminescent spots per 107 mm$^2$. In other words, the vertical axis corresponds to the number of luminescent spots in one SOI substrate.

The graphs of FIGS. 5B and 5C show that by performing heat treatment on an MCZ wafer at 1100° C. or higher under a non-oxidizing atmosphere before an SOI substrate is manufactured, an increase of the number of luminescent spots can be suppressed even when the number of times of use of the MCZ wafer is increased.

From the experience of the present inventors, in the case where a silicon wafer of 5 square inches is used for the bond substrate and a glass substrate is used for the base substrate, it is preferable that the number of luminescent spots in one SOI substrate be $1\times10^4$ or lower. In the case where a field-effect transistor is manufactured using an SOI substrate, leakage current is likely to be generated when the number of luminescent spots is more than $1\times10^4$.

Thus, the graphs of FIGS. 5B and 5C show that also in the case of using an MCZ wafer which is thought to have a low oxygen concentration in comparison with a CZ wafer, it is effective to perform heat treatment at 1100° C. or higher before the MCZ wafer is used for manufacturing an SOI substrate.

<Evaluation Method 2>

Figure 6:
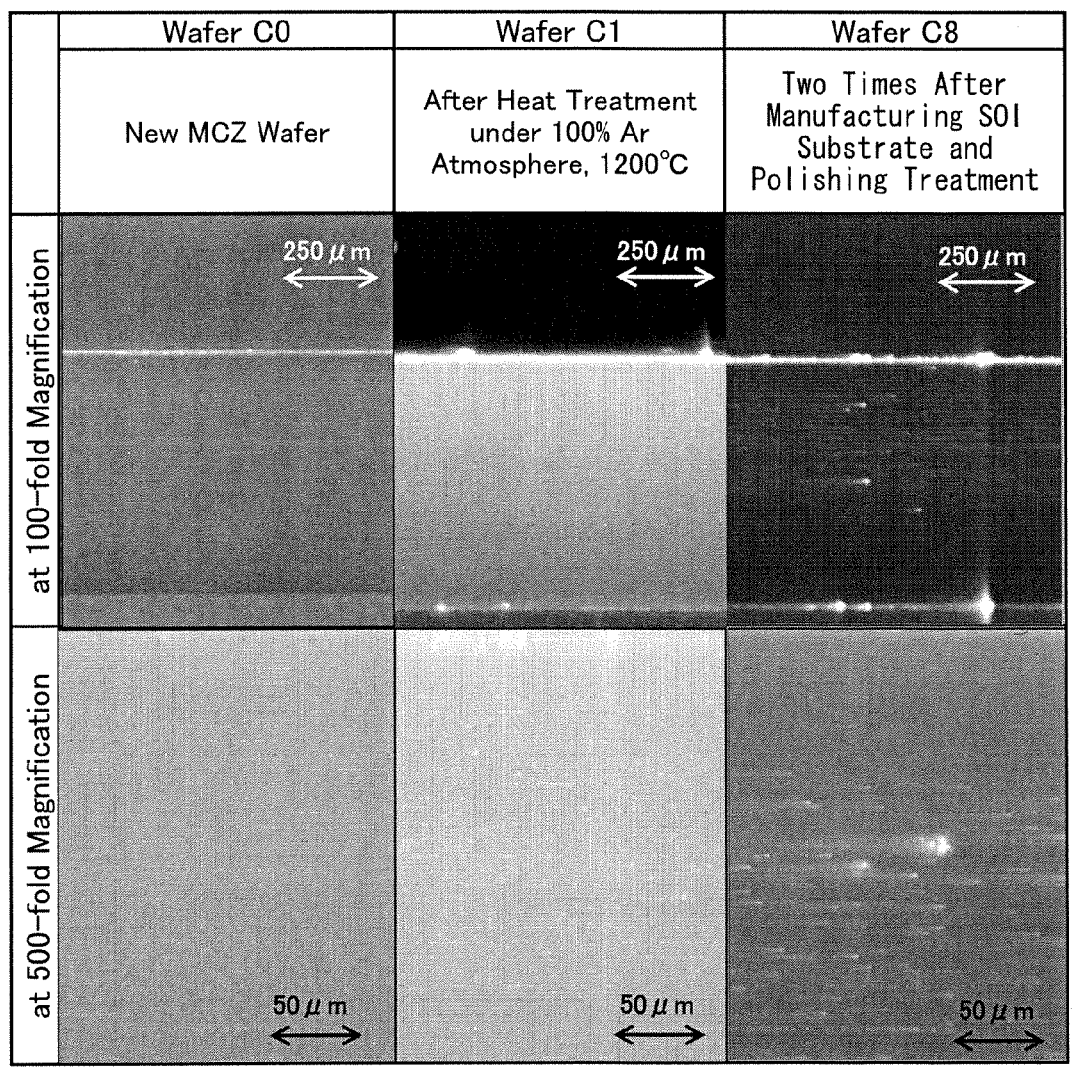
FIG. 6 is an image of cross-sections of MCZ single crystal silicon wafers observed with an infrared laser scattering tomography apparatus.

Further, as in Example 1, a new CZ wafer (wafer C0) which had been prepared in step b1 and an MCZ wafer (wafer C1) which had been subjected to the heat treatment in step b2 were cleaved, and IR-LST images were observed. FIG. 6 shows the IR-LST images of the wafer C0 and the wafer C1. Furthermore, FIG. 6 also shows that IR-LST images of a cross section of an MCZ wafer (referred to as a wafer C8) which has been subjected to the manufacturing process of an SOI substrate and polishing treatment two times each. Note that the wafer C8 was not attached to a base substrate as in step a5 in Example 1 and was only subjected to heat treatment under the same conditions as those of step b5.

When the wafer A1 (CZ wafer) in FIG. 4 and the wafer C1 (MCZ wafer) in FIG. 6 are compared, it can be confirmed that the wafer C1 has fewer luminescent spots (BMDs) than the wafer A1. When the thickness of a DZ is obtained from the IR-LST image at 500-fold magnification, the CZ wafer (wafer A4) in FIG. 4 which was used once for manufacturing an SOI substrate has an approximately 40-μm-thick DZ, and the wafer C8 in FIG. 6 has an approximately 80-μm-thick DZ. The MCZ wafer has a thicker DZ than the CZ wafer.

The difference in a DZ thickness between the CZ wafer and the MCZ wafer is mainly caused by the oxygen concentration. This is because the wafer C0 has a lower oxygen concentration than the wafer A0, so that the generation of BMDs is reduced even when heat treatment at high temperature is performed under the same conditions. The oxygen concentration of the wafer A0 (CZ wafer) measured with a Fourier transform infrared spectroscopy was $1.3\times10^{18}$ atoms/cm$^3$ to $1.8\times10^{18}$ atoms/cm$^3$ and that of the wafer C0 (MCZ wafer) was $0.8\times10^{18}$ atoms/cm$^3$ to $1.4\times10^{18}$ atoms/cm$^3$.

It can be found from Examples 1 and 2 that as the oxygen concentration of a semiconductor wafer is lower, a DZ becomes thicker. A DZ is preferably as thick as possible because the number of reuse of a semiconductor wafer without heat treatment at high temperature for reprocessing treatment can be increased. Further, in the case where a single crystal silicon wafer whose initial oxygen concentration exceeds $2\times10^{18}$ atoms/cm$^3$, or in the case where a wafer is used for the second manufacturing process of an SOI substrate without heat treatment at high temperature, a defective SOI substrate is more likely to occur. Therefore, it is preferable that the initial oxygen concentration of the semiconductor wafer be $2\times10^{18}$ atoms/cm$^3$ or lower to suppress a reduction in the yield of an SOI substrate.

As described above, the initial oxygen concentration of a semiconductor wafer is preferably low: preferably $1.8\times10^{18}$ atoms/cm$^3$ or lower, and more preferably $1.4\times10^{18}$ atoms/cm$^3$ or lower. Note that an FZ single crystal silicon wafer is known as a highly purified semiconductor wafer having an oxygen concentration of $1\times10^{16}$ atoms/cm$^3$ or lower; however, it is easily broken due to its high purity. In order to use a semiconductor wafer 20 times or more, the initial oxygen concentration is preferably $1\times10^{17}$ atoms/cm$^3$ or higher.

Example 3

In this example, a treatment time for heat treatment at high temperature before the manufacturing process of an SOI substrate is described.

<Experimental Method>

(d1) Preparation of CZ Wafer

A new CZ wafer which was the same as the wafer in Example 1 was used.

(d2) Heat Treatment Under Non-Oxidizing Atmosphere

Heat treatment was performed at 1200° C. under an Ar gas atmosphere (the proportion of the argon is 100%) in a heating furnace. Further, in this example, three conditions, 2 hours, 8 hours, and 16 hours, were set as the heat time.

(d3) Thermal Oxidation Treatment (Formation of Insulating Layer)

Under the same conditions as those of Example 1, heat treatment was performed at 950° C. for 3.5 hours under an $O_2$ gas atmosphere containing HCl at 3 volume %, so that a thermal oxide layer was made to a thickness of approximately 100 nm.

(d4) Hydrogen Doping (Formation of Embrittlement Region)

With the use of an ion doping apparatus, a $H_2$ gas (the proportion of the hydrogen is 100%) was excited, and the CZ wafer was irradiated with hydrogen ions with an acceleration voltage of 50 kV at a dose of $2.5\times10^{16}$ ions/cm$^2$.

(d5) Heat Treatment (Division of Wafer)

After the CZ wafer and a glass substrate were attached to each other, the CZ wafer was divided with an LPCVD apparatus under the same conditions as those of Example 2, so that an SOI substrate was manufactured. The heat treatment was performed at 200° C. for 2 hours, and then performed at 600° C. for 2 hours.

(d6) Laser Irradiation Treatment (Planarization of Single Crystal Silicon Layer)

In order to planarize the single crystal silicon layer of the SOI substrate manufactured in step d5, the single crystal silicon layer was irradiated with a laser beam. A XeCl excimer laser was used for the laser. The laser beam had a wavelength of 308 nm, a pulse width of 25 nanoseconds, and a repetition rate of 30 Hz. Further, while a $N_2$ gas (the proportion of the nitrogen is 100%) was sprayed on a region to be irradiated with the laser beam, a linear laser beam was scanned and the single crystal semiconductor layer was irradiated with the laser beam.

(d7) Polishing Treatment (Reprocessing of Wafer)

Polishing treatment was performed in a manner similar to that in Example 2. A thermal oxide layer was removed by wet etching with buffered hydrofluoric acid, and then, the surface where the single crystal silicon layer was separated was polished with a CMP apparatus.

(d8) Reuse of Wafer

In a manner similar to that in Example 2, the polishing treatment and the manufacturing process of an SOI substrate were repeatedly performed, so that a plurality of SOI substrates were manufactured using one CZ wafer. Here, six SOI substrates were manufactured using each of the two wafers on which the heat treatment in step d2 was performed for 2 hours. Six SOI substrates were manufactured using each of the three CZ wafers on which the heat treatment in step d2 was performed for 8 hours, and 13 SOI substrates were manufactured using three CZ wafers on which the heat treatment in step d2 was performed for 16 hours.

<Evaluation Method 1>

Figure 7A:
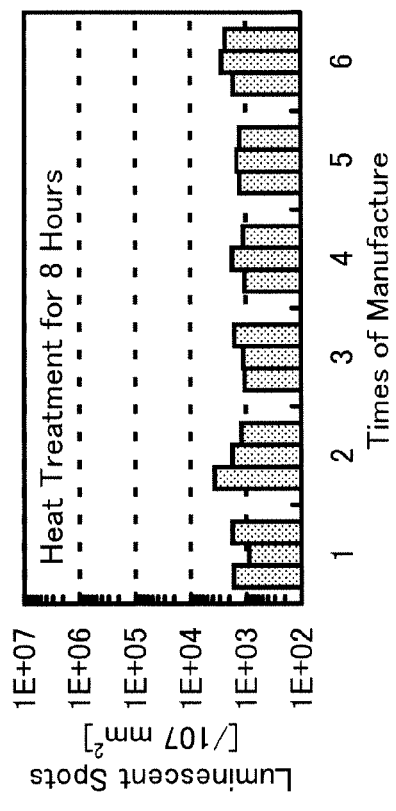
FIGS. 7A to 7C are graphs showing the number of luminescent spots in a dark-field image of a single crystal silicon layer of an SOI substrate in Example 3, observed with an optical microscope, with respect to the number of times of manufacture of the SOI substrate.
Figure 7B:
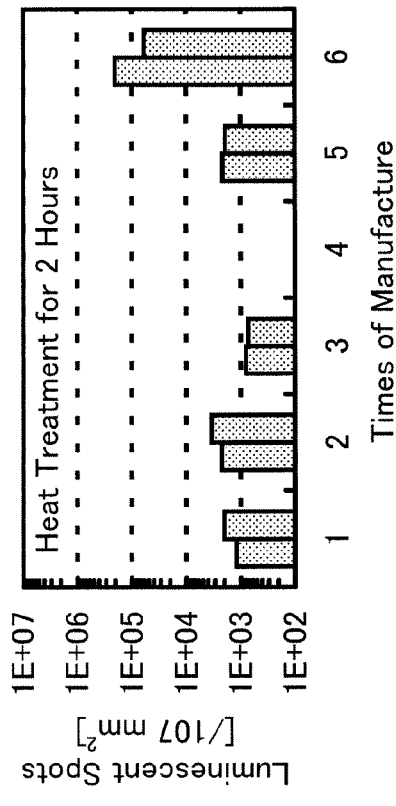
Figure 7C:
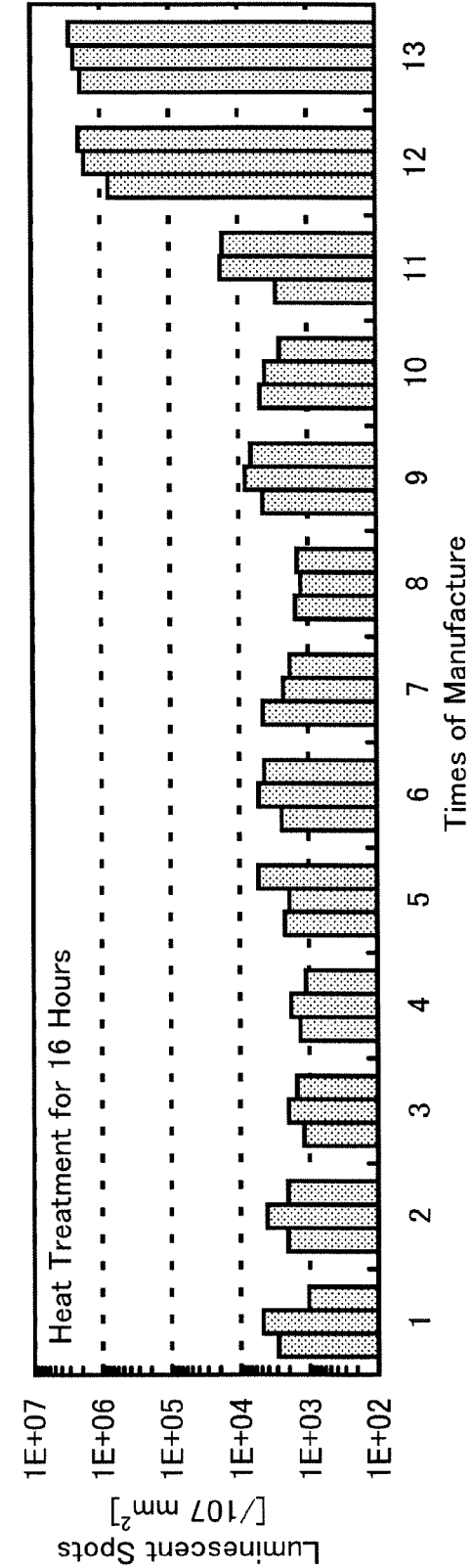

Also in this example, a surface of the silicon layer of the SOI substrate was observed with an optical microscope (200-fold magnification, a dark-field mode) and the number of luminescent spots was counted in the regions 301 to 303 in FIG. 5A by the same method as that in Example 2. The number of luminescent spots in the regions 301 to 303 was converted to the number of luminescent spots per 107 mm² (per one SOI substrate) by the same method as that in Example 2. The results are shown in FIGS. 7A, 7B, and 7C. FIG. 7A shows data in which the heat treatment time in step d2 is 2 hours, FIG. 7B shows data in which the heat treatment time is 8 hours, and FIG. 7C shows data in which the heat treatment time is 16 hours. Note that the number of luminescent spots was not counted at the fourth manufacturing process in FIG. 7A.

From the reasons described in Example 2, in the case where the number of luminescent spots in one SOI substrate exceeds $1\times10^4$ under the conditions of this example, it is considered that a defect occurs in the SOI substrate. It is found from the data in FIG. 7A that a wafer can be used 5 times without heat treatment at high temperature, by performing the heat treatment at high temperature for 2 hours. In addition, it is found from the data in FIGS. 7A to 7C that the number of times of reuse of a wafer without heat treatment at high temperature can be increased as the heat treatment time is increased.

In the experiments by the present inventors, effects similar to the effects of the heat treatment before manufacturing an SOI substrate described in Examples 1 to 3 can be obtained by heat treatment under a non-oxidizing atmosphere which is performed as reprocessing treatment. Thus, when the heat treatment time is increased, the number of times of reuse of a wafer can be increased without the next heat treatment at high temperature for reprocessing a wafer. The heat treatment time for reprocessing treatment can be 1 hour or longer and may be 1 hour to 24 hours inclusive. In consideration of productivity and an effect of forming a DZ by the heat treatment, the heat treatment time is preferably 6 hours to 20 hours inclusive.

Example 4

Effects of heat treatment at high temperature before the manufacturing process of an SOI substrate are described in this example. In this example, a new CZ wafer was repeatedly used in a manner similar to that in Example 2, so that an SOI substrate was manufactured. Heat treatment at high temperature on a new CZ wafer was performed in a heating furnace at 1200° C. for 2 hours under a mixed atmosphere in which an $O_2$ gas at 3 volume % was mixed into a $N_2$ gas.

Next, the silicon layer of the SOI substrate was evaluated in a manner similar to that in Example 2. A surface of the silicon layer of the SOI substrate was observed with an optical microscope (200-fold magnification, a dark-field mode) and the number of luminescent spots were counted in the regions 301 to 303 in FIG. 5A. Then, the number of luminescent spots in the regions 301 to 303 was converted to the number of luminescent spots per 107 mm² (per one SOI substrate) by the same method as that in Example 2. The results are shown in FIG. 9.

Figure 9:
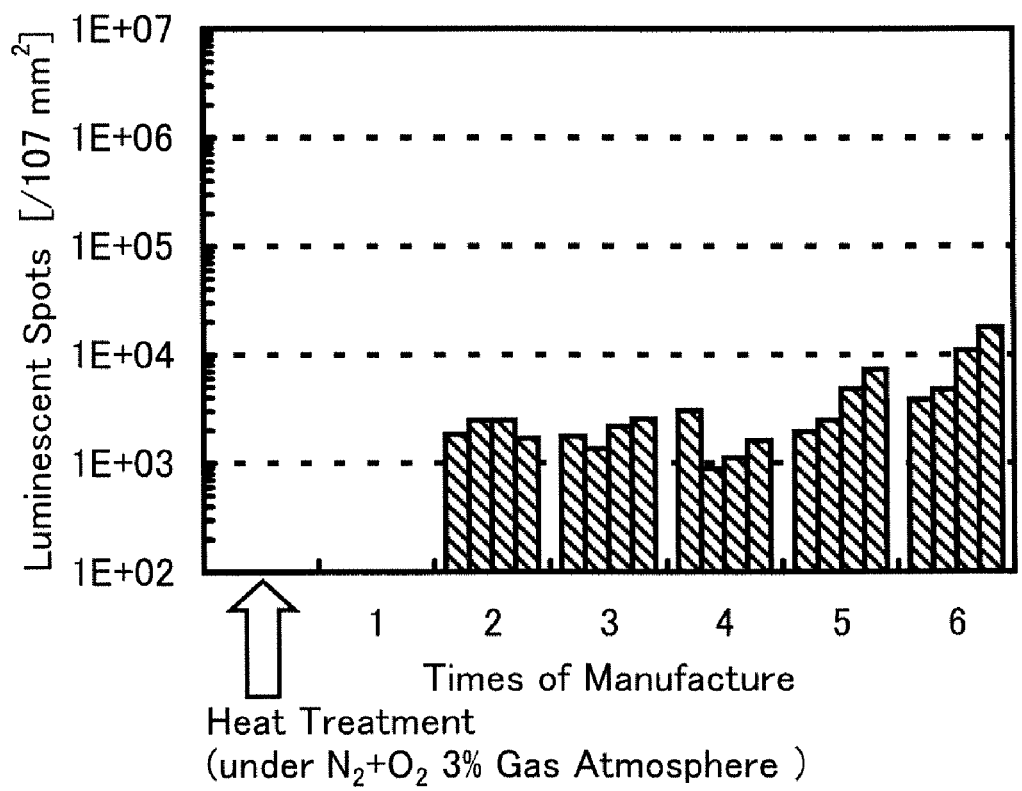
FIG. 9 is a graph showing the number of luminescent spots in a dark-field image of a single crystal silicon layer of an SOI substrate in Example 4, observed with an optical microscope, with respect to the number of times of manufacture of the SOI substrate.

The horizontal axis in FIG. 9 indicates the number of times of manufacture of an SOI substrate which corresponds to the number of times of use of a new CZ wafer. The vertical axis indicates the number of luminescent spots per 107 mm² (per one SOI substrate). FIG. 9 shows data of four SOI substrates. Note that data in the first manufacturing process is not shown.

When FIG. 9 and FIG. 5B in Example 2 were compared, it was found that by the heat treatment under an atmosphere in which an oxygen gas was added to a nitrogen gas, effects similar to the effects of the heat treatment for reprocessing treatment under a non-oxidizing atmosphere such as an Ar gas atmosphere (the proportion of the argon is 100%) could be obtained.

Example 5

Effects of heat treatment at high temperature before the manufacturing process of an SOI substrate are described in this example. In this example, a new MCZ wafer was repeatedly used in a manner similar to that in Example 2, so that an SOI substrate was manufactured. In this example, heat treatment at high temperature on a new MCZ wafer was performed at 1200° C. for 16 hours under an Ar gas atmosphere (the proportion of the argon is 100%) in a heating furnace.

Next, the silicon layer of the SOI substrate was evaluated in a manner similar to that in Example 2. A surface of the silicon layer of the SOI substrate was observed with an optical microscope (200-fold magnification, a dark-field mode) and the number of luminescent spots was counted in the regions 301 to 303 in FIG. 5A. Then, the number of luminescent spots in the regions 301 to 303 was converted to the number of luminescent spots per 107 mm² (per one SOI substrate) in the same method as that in Example 2. The results are shown in FIG. 10.

Figure 10:
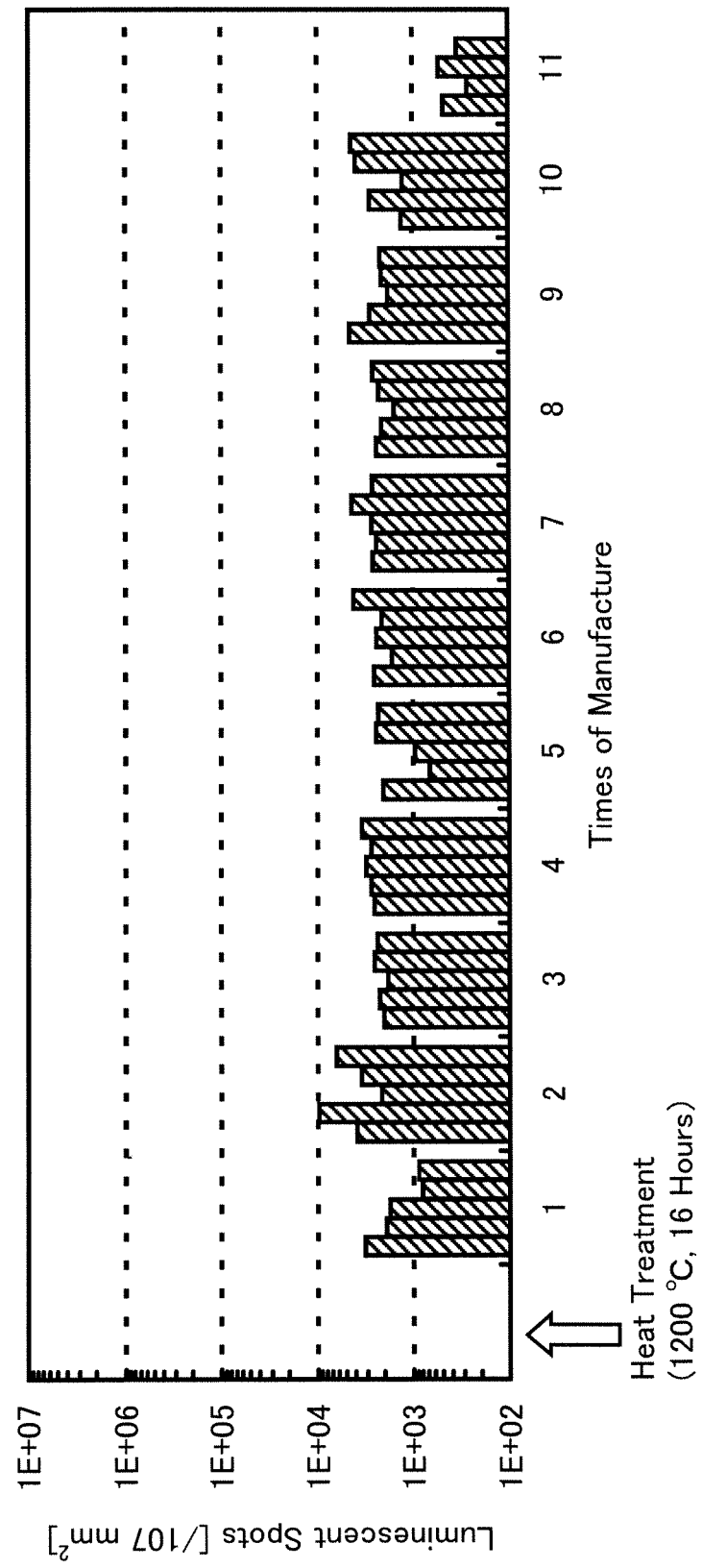
FIG. 10 is a graph showing the number of luminescent spots in a dark-field image of a single crystal silicon layer of an SOI substrate in Example 5, observed with an optical microscope, with respect to the number of times of manufacture of the SOI substrate.

The horizontal axis in FIG. 10 indicates the number of times of manufacture of an SOI substrate which corresponds to the number of times of use of a new MCZ wafer. The vertical axis indicates the number of luminescent spots per 107 mm² (per one SOI substrate). FIG. 10 shows data of five SOI substrates. Note that data of only the four SOI substrates is shown at the eleventh time.

FIG. 10 shows that even when an SOI substrate was manufactured using one MCZ wafer eleven times without heat treatment for reprocessing treatment, the number of luminescent spots was lower than $1\times10^4$ per one SOI substrate. In other words, FIG. 10 shows that by performing the heat treatment at high temperature on a semiconductor wafer before being used for manufacturing an SOI substrate, heat treatment is not necessarily performed every time reprocessing treatment is performed.

Example 6

Figure 11:
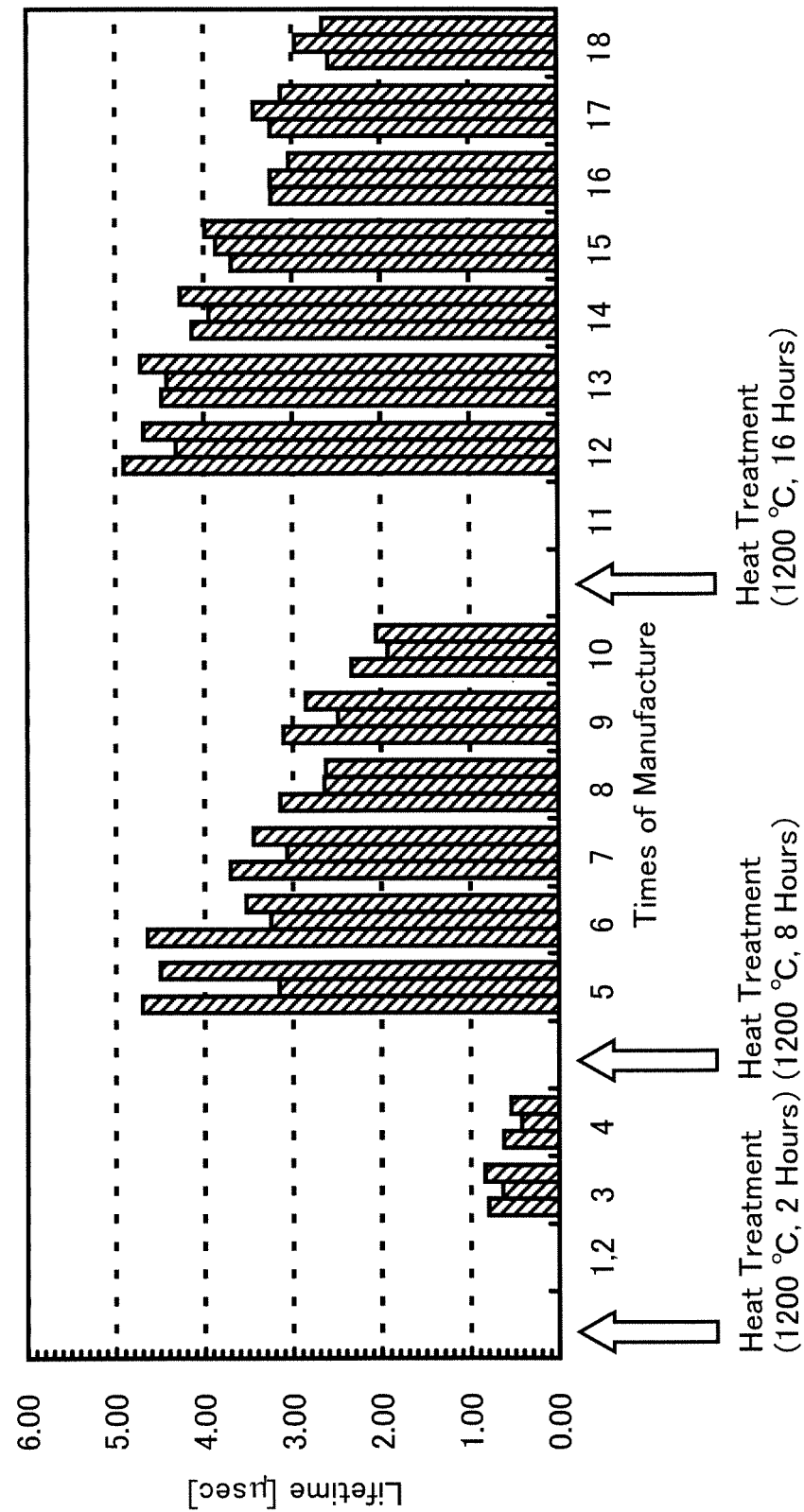
FIG. 11 is a graph showing the lifetime of a CZ single crystal silicon wafer in Example 6 with respect to the number of times of manufacture of an SOI substrate.

Here, an example of manufacturing an SOI substrate in FIG. 8 is described. A manufacturing process of an SOI substrate in this example is similar to that in Example 1, and a CZ wafer was used as the semiconductor wafer. The lifetime of the semiconductor wafer was measured to measure crystal defects in the semiconductor wafer. FIG. 11 is a graph showing lifetime measurement results of the CZ wafer with respect to the number of times of manufacture of an SOI substrate.

As shown in FIG. 11, heat treatment was performed at 1200° C. under an argon gas atmosphere (the proportion of the argon is 100%) at the following timings in this example.
heat treatment for 2 hours on a new CZ wafer
heat treatment for 8 hours on the CZ wafer which has been used 4 times
heat treatment for 16 hours on the CZ wafer which has been used 10 times FIG. 11 shows lifetime measurement results of three CZ wafers. Note that data at the first time, the second time, and the eleventh time is not shown. An apparatus (LTA-1800SP manufactured by Kobelco Research Institute, Inc.) for measuring a lifetime by a μ-PCD method was used for the measurement apparatus. In addition, the wafers were subjected to treatment with hydrofluoric acid to remove oxides on surfaces of the CZ wafers, and then measurement was performed. The measurement points were 529 points in a CZ wafer of 5 square inches.

In FIG. 11, the lifetimes of the CZ wafers were increased after heat treatment as reprocessing treatment was performed. Also in this example, the silicon layers of the SOI substrates were observed with an optical microscope as in Example 2. When the silicon layers of the SOI substrates manufactured at the third time, the fourth time, the ninth time, and the tenth time were observed with an optical microscope, many luminescent spots were observed and the lifetime and the number of luminescent spots were found to correlate with each other.

Thus, when the lifetime of a semiconductor wafer is measured and the result is lower than or equal to a reference value (or lower than a reference value), heat treatment may be performed on the semiconductor wafer as reprocessing treatment. In the case where a silicon wafer of 5 square inches is used for the bond substrate and a glass substrate is used for the base substrate, it is preferable that the lifetime of the silicon wafer to be the bond substrate be 3 microseconds or longer based on the experience of the present inventors. From the experience of the present inventors, it has been difficult to manufacture a high-quality SOI substrate using a silicon wafer whose lifetime is shorter than 3 microseconds. Note that the reference of 3 microseconds is used in the case where the lifetime is measured with the above lifetime measurement apparatus (LTA-1800SP) at one or two points per square inch (or 1.5 square inch) in one silicon wafer. The reference of the lifetime can be set by a practitioner as appropriate.

Further, it is found that even when an SOI substrate is manufactured under the same conditions, the lifetimes are different by 1 microsecond or more depending on wafers in some cases (e.g., see data at the fifth time and the sixth time in FIG. 11). Therefore, evaluating crystal defects in each semiconductor wafer to determine whether or not heat treatment should be performed as reprocessing treatment is extremely effective to maintain the quality and yield of an SOI substrate for which a reprocessed semiconductor wafer is used.

Example 7

This example shows measurement results of crystal defects in a semiconductor wafer used for manufacturing an SOI substrate. The lifetime of the semiconductor wafer was measured in this example as in Example 6.

Figure 12:
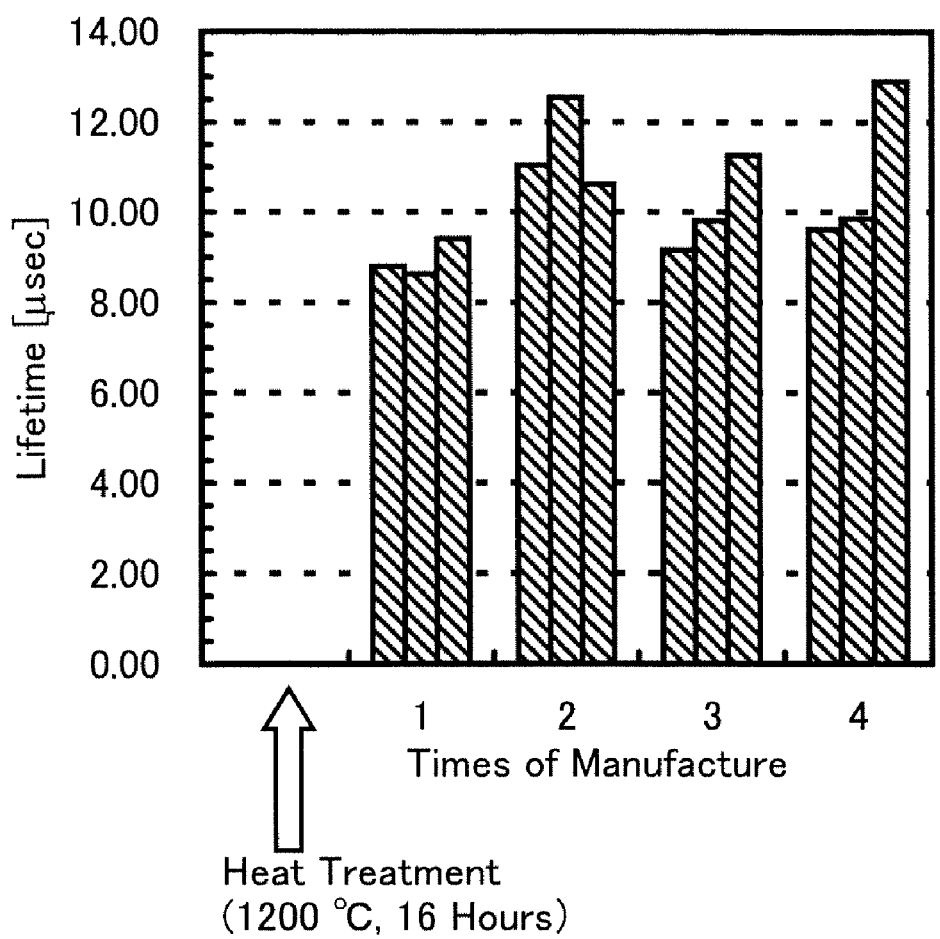
FIG. 12 is a graph showing the lifetime of an MCZ single crystal silicon wafer in Example 7 with respect to the number of times of manufacture of an SOI substrate.

In this example, an MCZ wafer was used for the semiconductor wafer. As the first heat treatment performed on a new MCZ wafer, heat treatment was performed at 1200° C. for 16 hours under an Ar gas atmosphere (the proportion of the argon is 100%). FIG. 12 is a graph showing measurement results of lifetimes of three MCZ wafers with respect to the number of times of manufacture of an SOI substrate.

FIG. 12 shows that even when an SOI substrate is manufactured under the same conditions using an MCZ wafer which is thought to have a lower oxygen concentration than a CZ wafer, the lifetimes are different by 2 microseconds or more depending on MCZ wafers in some cases. Therefore, this example shows that evaluating crystal defects in each semiconductor wafer to determine whether or not heat treatment should be performed as reprocessing treatment is extremely effective to maintain the quality and yield of an SOI substrate for which a reprocessed semiconductor wafer is used.

This application is based on Japanese Patent Application serial no. 2010-014880 filed with Japan Patent Office on Jan. 26, 2010, the entire contents of which are hereby incorporated by reference.

What is claimed is:

1. A method for manufacturing SOI substrates comprising the steps of:
    a first step of performing first heat treatment on a first semiconductor wafer using a heating furnace under a non-oxidizing atmosphere, thereby forming a second semiconductor wafer;
    a second step of forming a first insulating layer on a surface of the second semiconductor wafer;
    a third step of forming a first embrittlement region in the second semiconductor wafer by irradiating the second semiconductor wafer with a first ion;
    a fourth step of attaching the second semiconductor wafer to a first base substrate with the first insulating layer interposed therebetween;
    a fifth step of performing second heat treatment on the second semiconductor wafer, thereby forming a first semiconductor layer fixed to the first base substrate with the first insulating layer interposed therebetween and a third semiconductor wafer from which the first semiconductor layer is separated;
    a sixth step of performing chemical mechanical polishing on the third semiconductor wafer to planarize a surface of the third semiconductor wafer, thereby forming a fourth semiconductor wafer;
    a seventh step of forming a second insulating layer on a surface of the fourth semiconductor wafer;
    an eighth step of forming a second embrittlement region in the fourth semiconductor wafer by irradiating the fourth semiconductor wafer with a second ion;
    a ninth step of attaching the fourth semiconductor wafer to a second base substrate with the second insulating layer interposed therebetween; and
    an tenth step of performing third heat treatment on the fourth semiconductor wafer, thereby forming a second semiconductor layer fixed to the second base substrate with the second insulating layer interposed therebetween and a fifth semiconductor wafer from which the second semiconductor layer is separated,
    wherein a temperature of the second heat treatment and a temperature of the third heat treatment are lower than a temperature of the first heat treatment,
    wherein an oxygen concentration of the second semiconductor wafer is lower than an oxygen concentration of the first semiconductor wafer, and
    wherein the seventh step is performed after the sixth step without any heat treatment.

2. The method for manufacturing SOI substrates according to claim 1, wherein the first heat treatment is performed at 1100° C. or higher and 1300° C. or lower.

3. The method for manufacturing SOI substrates according to claim 1, wherein the non-oxidizing atmosphere comprises rare gas.

4. The method for manufacturing SOI substrates according to claim 1, wherein the non-oxidizing atmosphere comprises argon.

5. The method for manufacturing SOI substrates according to claim 1, wherein the first insulating layer is formed under an atmosphere comprising halogen.

6. The method for manufacturing SOI substrates according to claim 1, wherein an oxygen concentration of the first semiconductor wafer is $2 \times 10^{18}$ atoms/cm$^3$ or lower.

7. The method for manufacturing SOI substrates according to claim 1, further comprising the step of measuring a crystal defect in the fourth semiconductor wafer between the sixth step and the seventh step.

8. The method for manufacturing SOI substrates according to claim 7, wherein the crystal defect is measured by any one of the group consisting of an infrared light absorption spectroscopy, an infrared light interference method, Raman spectroscopy, a cathode luminescence method, a photoluminescence method, and a microwave photoconductivity decay method.

9. A method for manufacturing SOI substrates comprising the steps of:
   a first step of performing first heat treatment on a first semiconductor wafer using a first heating furnace under a first non-oxidizing atmosphere, thereby forming a second semiconductor wafer;
   a second step of forming a first insulating layer on a first surface of the second semiconductor wafer;
   a third step of forming a first embrittlement region in the second semiconductor wafer by irradiating the second semiconductor wafer with a first ion;
   a fourth step of attaching the second semiconductor wafer to a first base substrate with the first insulating layer interposed therebetween;
   a fifth step of performing second heat treatment on the second semiconductor wafer, thereby forming a first semiconductor layer fixed to the first base substrate with the first insulating layer interposed therebetween and a third semiconductor wafer from which the first semiconductor layer is separated;
   a sixth step of performing first chemical mechanical polishing on the third semiconductor wafer to planarize a surface of the third semiconductor wafer, thereby forming a fourth semiconductor wafer;
   a seventh step of forming a second insulating layer on a surface of the fourth semiconductor wafer;
   an eighth step of forming a second embrittlement region in the fourth semiconductor wafer by irradiating the fourth semiconductor wafer with a second ion;
   a ninth step of attaching the fourth semiconductor wafer to a second base substrate with the second insulating layer interposed therebetween;
   a tenth step of performing third heat treatment on the fourth semiconductor wafer, thereby forming a second semiconductor layer fixed to the second base substrate with the second insulating layer interposed therebetween and a fifth semiconductor wafer from which the second semiconductor layer is separated;
   an eleventh step of performing second chemical mechanical polishing on the fifth semiconductor wafer to planarize a surface of the fifth semiconductor wafer; and
   a twelfth step of performing fourth heat treatment on the fifth semiconductor wafer using a second heating furnace under a second non-oxidizing atmosphere, thereby forming a sixth semiconductor wafer,
   wherein a temperature of the second heat treatment and a temperature of the third heat treatment are lower than a temperature of the first heat treatment and a temperature of the fourth heat treatment,
   wherein an oxygen concentration of the second semiconductor wafer is lower than an oxygen concentration of the first semiconductor wafer, and
   wherein the seventh step is performed after the sixth step without any heat treatment.

10. The method for manufacturing SOI substrates according to claim 9, wherein the first heat treatment and the fourth heat treatment are performed at 1100° C. or higher and 1300° C. or lower.

11. The method for manufacturing SOI substrates according to claim 9, wherein the first non-oxidizing atmosphere and the second non-oxidizing atmosphere comprise rare gas.

12. The method for manufacturing SOI substrates according to claim 9, wherein the first non-oxidizing atmosphere and the second non-oxidizing atmosphere comprise argon.

13. The method for manufacturing SOI substrates according to claim 9, wherein the first insulating layer is formed under an atmosphere comprising halogen.

14. The method for manufacturing SOI substrates according to claim 9, further comprising the step of measuring a crystal defect in the fourth semiconductor wafer between the sixth step and the seventh step.

15. The method for manufacturing SOI substrates according to claim 14, wherein the crystal defect is measured by any one of the group consisting of an infrared light absorption spectroscopy, an infrared light interference method, Raman spectroscopy, a cathode luminescence method, a photoluminescence method, and a microwave photoconductivity decay method.

16. The method for manufacturing SOI substrates according to claim 9, wherein an oxygen concentration of the first semiconductor wafer is $2\times10^{18}$ atoms/cm$^3$ or lower.

* * * * *